United States Patent
Lee et al.

(10) Patent No.: US 9,773,796 B2
(45) Date of Patent: Sep. 26, 2017

(54) NON-VOLATILE MEMORY DEVICE

(71) Applicants: Chang Hyun Lee, Suwon-si (KR); Jin-Kyu Kim, Suwon-si (KR)

(72) Inventors: Chang Hyun Lee, Suwon-si (KR); Jin-Kyu Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/640,784

(22) Filed: Mar. 6, 2015

(65) Prior Publication Data
US 2015/0318293 A1    Nov. 5, 2015

(30) Foreign Application Priority Data
Apr. 30, 2014 (KR) ........................ 10-2014-0052053

(51) Int. Cl.
| H01L 27/115 | (2017.01) |
| H01L 27/11556 | (2017.01) |
| H01L 27/11573 | (2017.01) |
| H01L 27/11524 | (2017.01) |
| H01L 27/11529 | (2017.01) |
| H01L 27/11541 | (2017.01) |

(52) U.S. Cl.
CPC .. *H01L 27/11556* (2013.01); *H01L 27/11524* (2013.01); *H01L 27/11529* (2013.01); *H01L 27/11541* (2013.01); *H01L 27/11573* (2013.01)

(58) Field of Classification Search
CPC .............................................. H01L 27/11556
See application file for complete search history.

(56) References Cited

U.S. PATENT DOCUMENTS 5,759,897 A * 6/1998 Kadosh ............... H01L 29/7835
                                                   257/E21.427
5,923,982 A * 7/1999 Kadosh ............. H01L 29/66659
                                                   257/E21.427
(Continued)

FOREIGN PATENT DOCUMENTS

| KR | 20000001084 A | 1/2000 |
| KR | 20040002204 A | 1/2004 |

(Continued)

*Primary Examiner* — Fernando L Toledo
*Assistant Examiner* — Valerie N Newton
(74) *Attorney, Agent, or Firm* — Harness, Dickey & Pierce, P.L.C.

(57) ABSTRACT

A non-volatile memory device including a cell array area including a plurality of memory cells and word lines and bit lines, which are connected to the plurality of memory cells, a core circuit area including a page buffer circuit and a row decoder circuit, the pager buffer circuit configured to temporarily store data input to and output from the plurality of memory cells, and the row decoder circuit configured to select some of the word lines corresponding to an address input thereto, and an input/output circuit area including a data input/output buffer circuit, the data input/output buffer circuit configured to at least one of transmit data to the page buffer circuit and receive data from the page buffer circuit, and the input/output circuit area including at least one asymmetrical transistor having a source region and a drain region asymmetrically disposed with respect to the gate structure may be provided.

18 Claims, 18 Drawing Sheets

(56) References Cited

U.S. PATENT DOCUMENTS

| | | | |
|---|---|---|---|
| 5,985,724 A * | 11/1999 | Kadosh | H01L 21/28176 257/E21.194 |
| 6,009,011 A * | 12/1999 | Yamauchi | H01L 27/115 257/E27.103 |
| 6,255,174 B1 * | 7/2001 | Yu | H01L 21/26586 257/E21.345 |
| 6,967,143 B2 | 11/2005 | Mathew et al. | |
| 7,221,028 B2 | 5/2007 | Yu et al. | |
| 7,391,080 B2 | 6/2008 | Arnborg et al. | |
| 8,101,479 B2 | 1/2012 | Parker et al. | |
| 8,193,065 B2 | 6/2012 | Johnson et al. | |
| 8,975,928 B1 * | 3/2015 | Liu | H03K 19/0185 327/108 |
| 2003/0047781 A1 * | 3/2003 | Lee | H01L 29/78624 257/347 |
| 2012/0163081 A1 * | 6/2012 | Park | G11C 16/26 365/185.11 |
| 2012/0228709 A1 * | 9/2012 | Anderson | H01L 21/823412 257/348 |
| 2013/0153981 A1 * | 6/2013 | Han | H01L 21/28273 257/321 |

FOREIGN PATENT DOCUMENTS

| | | |
|---|---|---|
| KR | 100504187 B1 | 7/2005 |
| KR | 20090038158 A | 4/2009 |

\* cited by examiner

NON-VOLATILE MEMORY DEVICE

CROSS-REFERENCE TO RELATED APPLICATION

This application claims priority under 35 U.S.C. §119 to Korean Patent Application No. 10-2014-0052053 filed on Apr. 30, 2014, with the Korean Intellectual Property Office, the disclosure of which is incorporated herein by reference in its entirety.

BACKGROUND

Example embodiments in the present disclosure relate to non-volatile memory devices.

In accordance with industrial and multimedia developments, the degrees of integration and functionality of semiconductor memory devices used in electronic devices (e.g., computers or mobile devices) have increased. As the degree of integration of semiconductor memory devices have increased, the design rule for such components has tightened. Accordingly, a size of a memory cell within the semiconductor memory device as well as a size of a transistor configuring a peripheral circuit, which controls the memory cell, may be reduced. A channel length of the transistor may be shortened in accordance with the decrease in the size of the transistor.

SUMMARY

Some example embodiments in the present disclosure may provide non-volatile memory devices having improved reliability.

According to an example embodiment in the present disclosure, a non-volatile memory device includes a cell array area including a plurality of memory cells and word lines and bit lines connected to the plurality of memory cells, a core circuit area including a page buffer circuit and a row decoder circuit, the page buffer circuit configured to temporarily storing data input to and output from the plurality of memory cells and the row decoder circuit configured to select some of the word lines corresponding to an address input thereto, and an input/output circuit area including a data input/output buffer circuit, the data input/output buffer circuit configured to at least one of transmit data to the page buffer circuit and receive data from the page buffer circuit, the input/output circuit area including at least one asymmetrical transistor having a source region and a drain region asymmetrically disposed with respect to a gate structure.

The drain region of the at least one asymmetrical transistor may include a first drain region and a second drain region, which is doped with impurities at a higher level of concentration than that of the first drain region.

A distance from a central axis of the gate structure to the second drain region may be greater than a distance from the central axis of the gate structure to the source region.

The source region of the at least one asymmetrical transistor may include a first source region and a second source region, which is doped with impurities at a higher level of concentration than that of the first source region, and a distance from a central axis of the gate structure to the second drain region may be greater than a distance from the central axis of the gate structure to the second source region.

The first source region and the first drain region may have junction depths smaller than those of the second source region and the second drain region. The first source region and the first drain region may be disposed in portions of the substrate adjacent to the gate structure, and at least one portion of the first source region and at least one portion of the first drain region may extend below the gate structure.

The at least one asymmetrical transistor may further include a first spacer disposed on one side of the gate structure and a second spacer disposed on other side of the gate structure.

The first spacer and the second spacer may be symmetrically disposed with respect to the gate structure.

The first spacer may include a first spacer insulating layer having an L-shaped cross-section and a second spacer insulating layer, and a thickness of the first spacer from the one side surface of the gate structure may be greater than that of the second spacer from an opposite side surface of the gate structure.

A thickness of the second spacer insulating layer from the one side surface of the gate structure may be greater than that of the first spacer insulating layer.

The drain region may include a first drain region and a second drain region doped with impurities at a higher level of concentration than that of the first drain region, and at least one portion of the second drain region may extend below the first spacer.

The non-volatile memory device may include a plurality of asymmetrical transistors, which include the at least one asymmetrical transistor and is disposed in the input/output circuit area. The plurality of asymmetrical transistors each may include the first and second spacers.

The non-volatile memory device may further include a buffer insulating layer between the gate structure and the first and second spacers.

The cell array area may include a plurality of channel regions, which extends in a first direction, a plurality of cell gate electrodes crossing the channel regions in a second direction while being spaced apart from each other, and a plurality of gate dielectric layers disposed between the channel regions and the cell gate electrodes.

The core circuit area may include at least one symmetrical transistor having a source region and a drain region symmetrically disposed with respect to a gate.

According to an example embodiment in the present disclosure, a non-volatile memory device may include a cell array area including a plurality of memory cells, a peripheral circuit area configured to control an operation of the plurality of memory cells, the peripheral circuit area including at least one asymmetrical transistor having a source region and a drain region asymmetrically disposed with respect to a gate structure.

According to an example embodiment in the present disclosure, a non-volatile memory device includes a peripheral circuit area including, a first circuit area including an asymmetrical transistor, the asymmetrical transistor having a source region and a drain region asymmetrically disposed with respect to a gate structure, and a second circuit area including a symmetrical transistor, the symmetrical transistor having a source region and a drain region symmetrically disposed with respect to a gate structure.

The second circuit area may include at least one of a page buffer circuit and a row decoder.

The first circuit area may include an input/output circuit.

The drain region of the asymmetrical transistor may include a first drain region and a second drain region, which is doped with impurities at a higher level of concentration than that of the first drain region, and a distance from a central axis of the gate structure of the asymmetrical transistor to the second drain region is greater than a distance from the central axis of the gate structure to the source region.

The drain region of the asymmetrical transistor may include a first drain region and a second drain region, which is doped with impurities at a higher level of concentration than that of the first drain region, the source region of the asymmetrical transistor includes a first source region and a second source region, which is doped with impurities at a higher level of concentration than that of the first source region, and a distance from a central axis of the gate structure of the asymmetrical transistor to the second drain region is greater than a distance from the central axis of the gate structure of the asymmetrical transistor to the second source region.

BRIEF DESCRIPTION OF DRAWINGS

The above and other aspects, features and other advantages of the present disclosure will be more clearly understood from the following detailed description of some example embodiments taken in conjunction with the accompanying drawings, in which.

DETAILED DESCRIPTION

Figure 1:
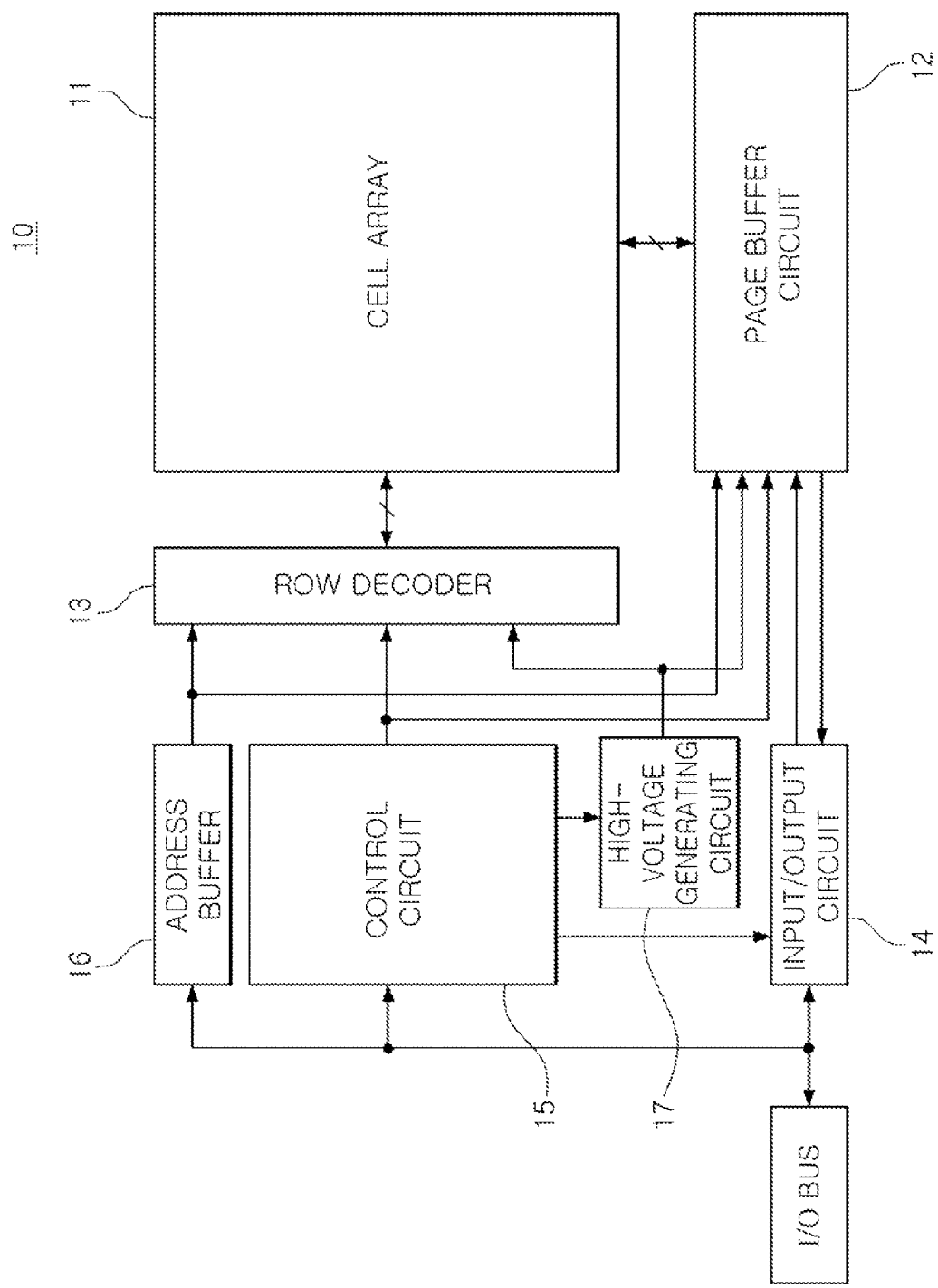
FIG. 1 is a block diagram illustrating a non-volatile memory device according to an example embodiment in the present disclosure.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are merely provided so that this disclosure will be thorough and complete, and will fully convey the scope of example embodiments to those skilled in the art. In the drawings, the sizes and relative sizes of the various layers and regions may have been exaggerated for clarity. Like numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Expressions such as "at least one of," when preceding a list of elements, modify the entire list of elements and do not modify the individual elements of the list.

Some example embodiments of the present disclosure will now be described in detail with reference to the accompanying drawings.

FIG. 1 is a block diagram illustrating a non-volatile memory device according to an example embodiment of the present disclosure.

Referring to FIG. 1, a non-volatile memory device 10 according to an example embodiment of the present disclosure may include a cell array 11, a page buffer circuit 12, a row decoder 13, an input/output circuit 14, a control circuit 15, an address buffer 16, and a high-voltage generating circuit 17.

The cell array 11 may be configured of a plurality of cell blocks and each of the cell blocks may include a plurality of memory cell elements for storing data therein. The memory cell elements may be connected to respective word lines and bit lines.

The page buffer circuit 12 may include a column decoder and a sensing amplifier and may be connected to the cell array 11 through the bit lines. The page buffer circuit 12 may temporarily store data in a selected memory cell and read data from the selected memory cell. The column decoder may selectively activate bit lines BL of the cell array 11, and the sensing amplifier may sense a voltage of the bit line selected by the column decoder during a reading operation to read out the data stored in the selected memory cell.

The row decoder 13 may selectively activate word lines WL of the cell array 11, and generate and transfer a word line driving signal corresponding to an address signal.

The input/output circuit 14 may be internally connected to the page buffer circuit 12 and may be externally connected to an external memory controller through an input/output bus (I/O bus). The input/output circuit 14 may receive data to be programmed (or stored) from the memory controller during a programming operation and may provide read data received from the page buffer circuit 12 to the memory controller during the reading operation.

The control circuit 15 may generate a control signal to provide the control signal to the high-voltage generating circuit 17 and may control operations of the page buffer circuit 12 and the row decoder 13.

The high-voltage generating circuit 17 may receive the control signal from the control circuit 15 and in response thereto, may generate a programming voltage.

Figure 2:
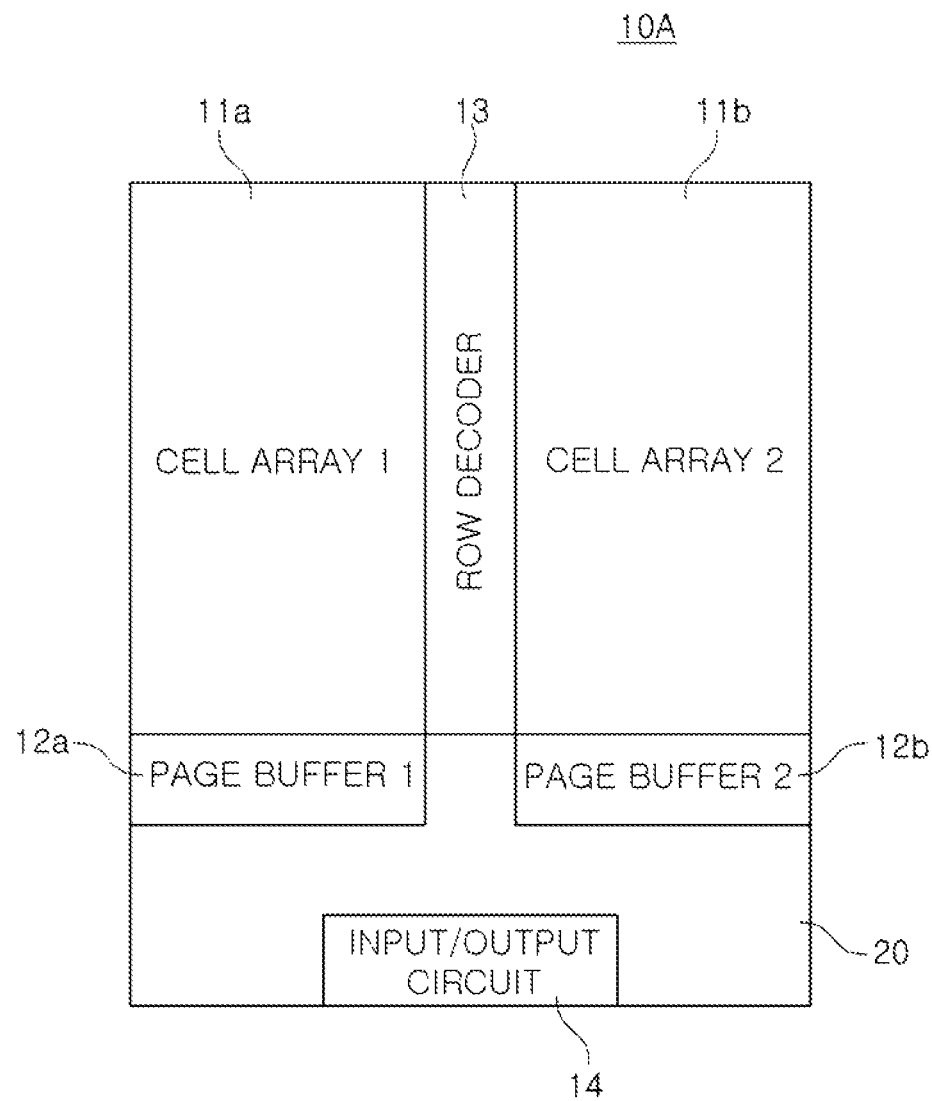
FIG. 2 is a layout diagram illustrating a non-volatile memory device according to an example embodiment in the present disclosure.

FIG. 2 is a layout diagram illustrating a non-volatile memory device according to an example embodiment of the present disclosure.

Referring to FIG. 2, in a non-volatile memory device 10A according to an example embodiment of the present disclosure, cell arrays 11a and 11b are disposed on both sides of the row decoder 13 and page buffer circuits 12a and 12b may be disposed below the corresponding cell arrays 11a and 11b, respectively. In the present disclosure, a peripheral circuit area including the page buffer circuit 12 and the row decoder 13 is referred to as a core circuit area. The input/output circuit 14 may be disposed at a lower end of the memory device and may be externally connected through the input/output bus (I/O bus). Other peripheral circuits including the control circuit 15, the address buffer 16, and the high-voltage generating circuit 17 of FIG. 1 may be disposed in a remaining peripheral circuit area 20. The foregoing arrangement of the cell array and the peripheral circuit is provided by way of an example, and arrangements of the cell array and the peripheral circuit in the non-volatile memory device according to example embodiments of the present disclosure are not limited thereto.

In the non-volatile memory device 10A according to the example embodiment of the present disclosure, a symmetrical transistor may be disposed in the core circuit area including the page buffer circuit 12 and the row decoder 13, and an asymmetrical transistor may be disposed in an area of the input/output circuit (which includes an input/output buffer circuit) at which a relatively high degree of reliability in terms of operational characteristics thereof is desired. These features will be described in detail with reference to FIG. 3.

Figure 3:
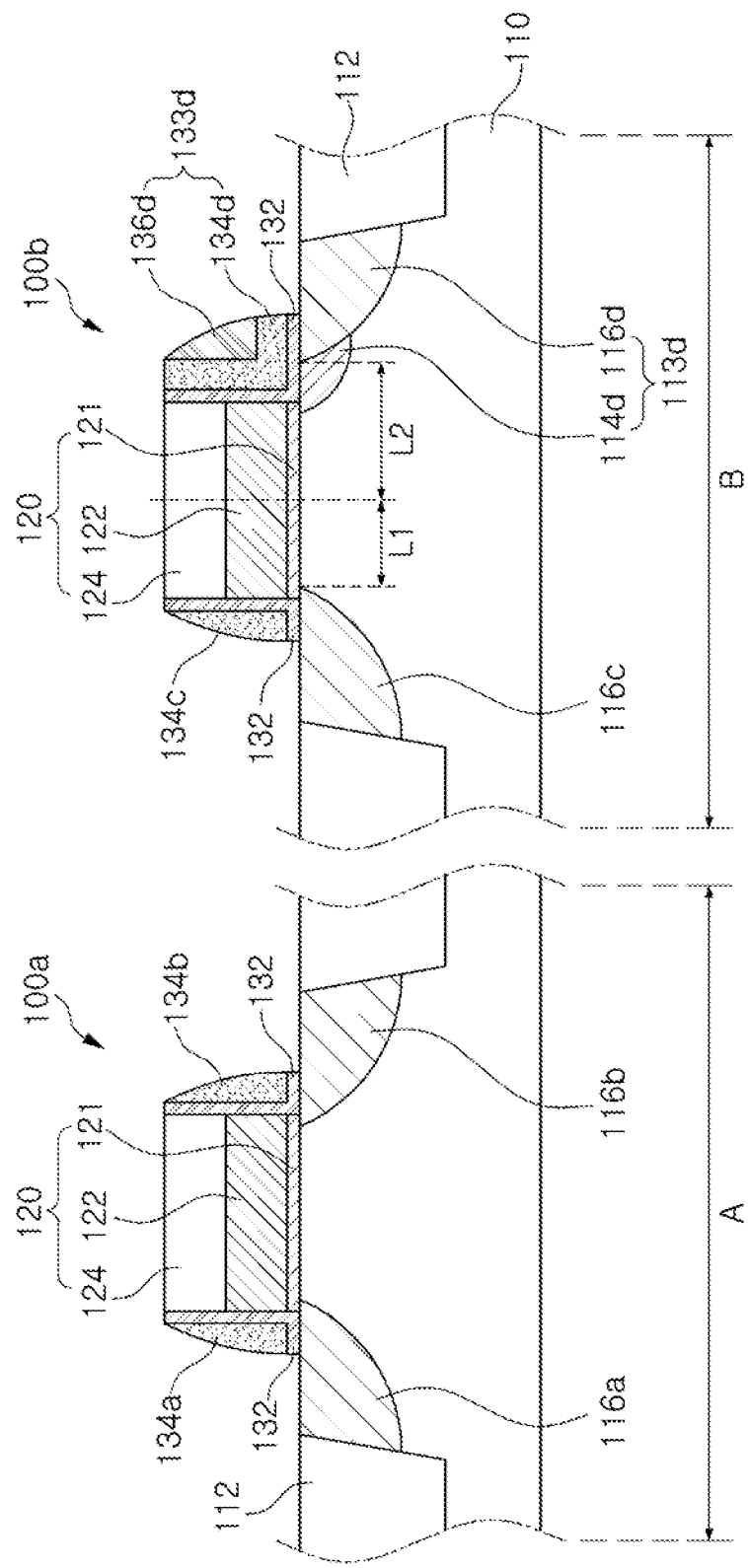
FIG. 3 is cross-sectional views of a pair of transistors according to an example embodiment in the present disclosure.

FIG. 3 shows cross-sectional views of a pair of transistors according to an example embodiment of the present disclosure.

Referring to FIG. 3, in the non-volatile memory device according to an example embodiment of the present disclosure, a symmetrical transistor 100a and an asymmetrical transistor 100b may be respectively disposed in a core circuit area A and an input/output circuit area B of a substrate 110. The respective symmetrical transistor 100a and asymmetrical transistor 100b may include gate structures 120, buffer insulating layers 132, spacers 134a, 134b, 134c and 133d, source regions 116a and 116c, and drain regions 116b and 113d.

In a peripheral circuit area of the substrate 110, the active regions, in which the transistors are disposed, may be isolated from each other by a device isolation layer 112. The symmetrical transistor 100a and the asymmetrical transistor 100b may be, for example, a metal oxide semiconductor field effect transistor (MOSFET). The substrate 110 may be, for example, a substrate doped with p-type impurities or a substrate doped with n-type impurities including a p-type well.

The gate structure 120 of the symmetrical transistor 100a may include, for example, a gate insulating layer 121, a gate electrode 122 and a mask insulating layer 124 sequentially stacked on the substrate 110.

The gate insulating layer 121 may be, for example, a silicon oxide layer grown through thermal oxidation. Depending on example embodiments, the gate insulating layer 121 may be formed by thermally treating the substrate 110 under nitrogen ($N_2$), a nitrous oxide ($N_2O$), or a nitric oxide (NO) gas atmosphere. The gate electrode 122 may be formed by, for example, sequentially stacking a polysilicon layer doped with impurities and a metallic silicide layer.

The source region 116a and the drain region 116b that are doped with impurities at the same concentration may be formed in the substrate 110 adjacent to the gate structure 120 so as to be arranged at positions corresponding to both side of the gate structure 120. At least one portion of the source region 116a and the drain region 116b may extend below the gate structure 120 toward a central portion of the gate structure 120. The source region 116a and the drain region 116b may be symmetrically disposed with respect to the gate structure 120. The source and drain regions may be, for example, regions in which ions of n-type impurities are implanted.

The symmetrical transistor 100a may further include the spacers 134a and 134b symmetrically disposed on the both side surfaces of the gate structure 120. The spacers 134a and 134b may be formed of the same material (e.g., silicon oxide layer) and may have the same thickness and shape as each other. Further, the buffer insulating layer 132 may be disposed between the spacers 134a and 134b and the gate structure 120. The buffer insulating layer 132 may extend between the spacers 134a and 134b and the source and drain regions 116a and 116d.

The gate structure 120 of the asymmetrical transistor 100b may include the gate insulating layer 121, the gate electrode 122, and the mask insulating layer 124 sequentially stacked on the substrate 110.

The gate insulating layer 121 may be, for example, a silicon oxide layer grown through thermal oxidation. Depending on example embodiments, the gate insulating layer 121 may be formed by thermally treating the substrate 110 under nitrogen ($N_2$), a nitrous oxide ($N_2O$), or a nitric oxide (NO) gas atmosphere. The gate electrode 122 may be formed by, for example, sequentially stacking a polysilicon layer doped with impurities and a metallic silicide layer.

The source region 116c and the drain region 113d may be formed in the substrate 110 at positions corresponding to both side of the gate structure 120. The source region 116c may be a single region doped with impurities at a high concentration, while the drain region 113b may include a first drain region 114d and a second drain region 116d doped with impurities at a concentration greater than that of the first drain region 114d. A distance L2 from a central axis of the gate structure 120 to the second drain region 116d may be greater than a distance L1 from the central axis of the gate structure 120 to the source region 116c. In addition, a junction depth of the first drain region 114d from an upper surface of the substrate 110 may be smaller than that of the second drain region 116d. At least one portion of the source region 116c and the first drain region 114d may extend below the gate structure 120 toward the central portion of the gate structure 120. At least one portion of the second drain region 116d may extend below the first spacer 133d, and this feature will be described in detail later.

The source and drain regions may be, for example, regions in which ions of n-type impurities are implanted.

The asymmetrical transistor 100b may further include the first spacer 133d disposed on one side of the gate structure 120 and the second spacer 134c disposed on the other side of the gate structure 120. The first spacer 133d may include a first spacer insulating layer 134d and a second spacer insulating layer 136d. The first spacer insulating layer 134d may have an L-shaped cross-section. A thickness of the first spacer 133d from the one side surface of the gate structure 120 may be greater than that of the second spacer 134c. A maximum lateral thickness of the second spacer insulating layer 136d with respect to the side surface of the gate structure 120 may be greater than that of the first spacer insulating layer 134d. The second spacer insulating layer 136d and the first spacer insulating layer 134d may be formed of materials having etch selectivity with respect to each other. For example, the first spacer insulating layer 134d may be, for example, a silicon oxide layer and the second spacer insulating layer 136d may be, for example, a silicon nitride layer. The buffer insulating layer 132 may be further disposed between the first spacers 133d and the gate structure 120, and between the second spacer 134c and the gate structure 120. The buffer insulating layer 132 may extend between the first spacer 133d and the drain region 113d and extend between the second spacer 134c and the source region 116c.

Comparing characteristics of the symmetrical transistor 100a and the asymmetrical transistor 100b with each other, in the asymmetrical transistor 100b, a saturation current (Idsat) at an operating voltage may be reduced by, for example, about 3%, but a drain voltage Vd having a lifetime of 10 years may be increased by, for example, about 20% in the evaluation of drain-avalanche hot-carrier stress test, as compared to the symmetrical transistor 100a. As such, the asymmetrical transistor 100b according to an example embodiment of the present disclosure may have operational characteristics similar to the symmetrical transistor 100a, while showing significantly improved hot carrier characteristics substantially the same as or similar to the symmetrical transistor 100a. Thus, according to an example embodiment of the present disclosure, the asymmetrical transistor 100b may be disposed in the area of the input/output circuit 14 (see FIGS. 1 and 2) at which a relatively high level of reliability is desired, thereby obtaining a non-volatile memory device having improved reliability.

Depending on example embodiments, the asymmetrical transistor 100b may also be disposed in other peripheral circuit areas including the core circuit area, as well as in the area of the input/output circuit 14.

Although not illustrated, non-volatile memory devices according to some example embodiments of the present disclosure may include, in the peripheral circuit area, low voltage and high voltage transistors. The low voltage and high voltage transistors may include spacers having a dual spacer structure (e.g., the first spacer 133d of the asymmetrical transistor 100b) symmetrically disposed on both sides of the gate structure such that the source region and the drain region of each of the low voltage and high voltage transistors are symmetrically disposed with respect to the corresponding gate structure.

FIGS. 4A through 4F are cross-sectional views illustrating a method of manufacturing transistors according to an example embodiment of the present disclosure. The method of manufacturing the symmetrical transistor 100a and the asymmetrical transistor 100b of FIG. 3 will be described in detail with reference to FIGS. 4A through 4F.

Figure 4A:
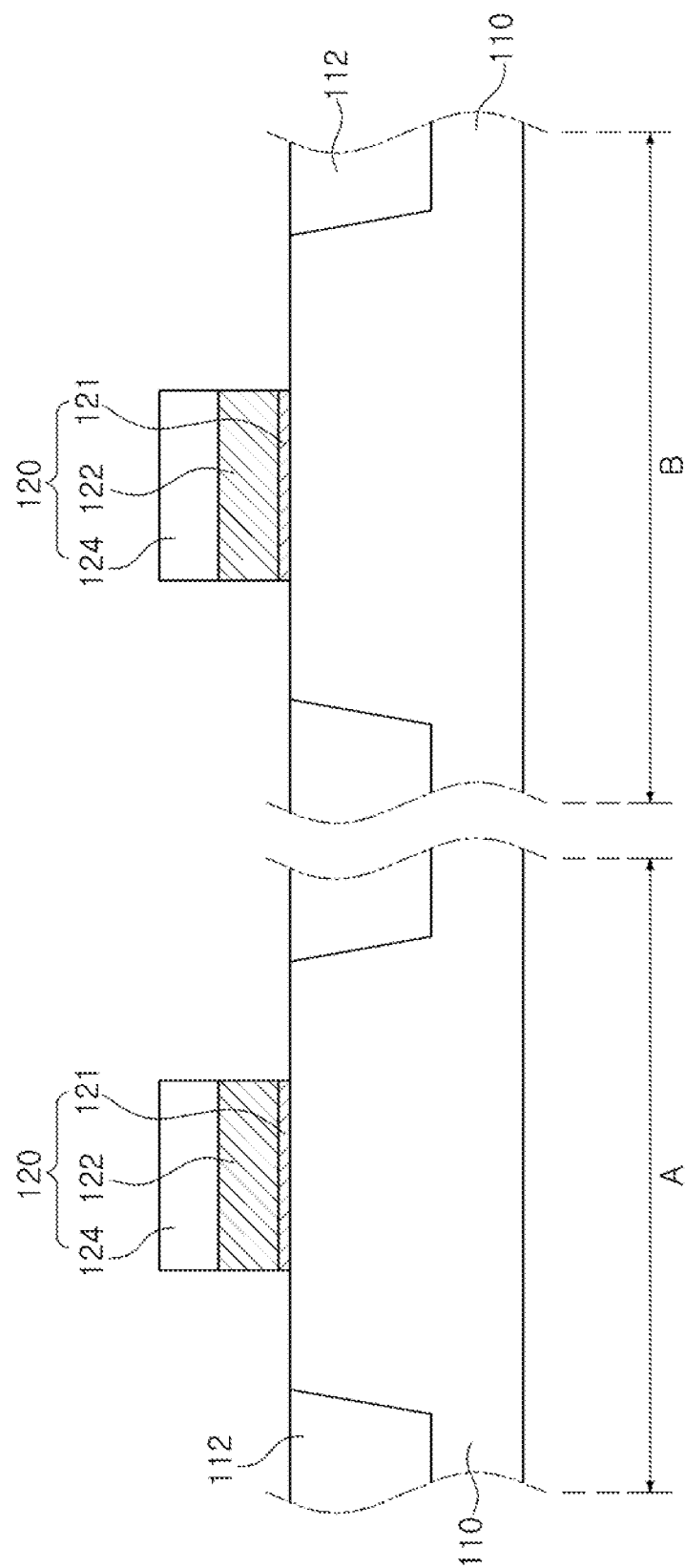
FIGS. 4A through 4F are cross-sectional views illustrating a method of manufacturing transistors according to an example embodiment in the present disclosure.

Referring to FIG. 4A, the gate structures 120 may be formed on the substrate 110 including the core circuit area A and the input/output circuit area B.

Processes of manufacturing the symmetrical transistor and the asymmetrical transistor may be simultaneously performed. First, a trench may be formed in the substrate 110 through a photolithography process in order to define active regions in which the transistors will be disposed, and the device isolation layer 112 may be formed in the trench through, for example, a chemical vapor deposition process.

The gate insulating film 121, the gate electrode 122, and the mask insulating layer 124 may be sequentially stacked on the substrate 110 divided into a plurality of the active regions by the device isolation layer 112. Then, the mask insulating layer 124 may be patterned through a photolithography process. The gate electrode 122 and the gate insulating film 121 may be, for example, dry-etched using the patterned mask insulating layer 124 as an etching mask to form the gate structure 120.

Figure 4B:
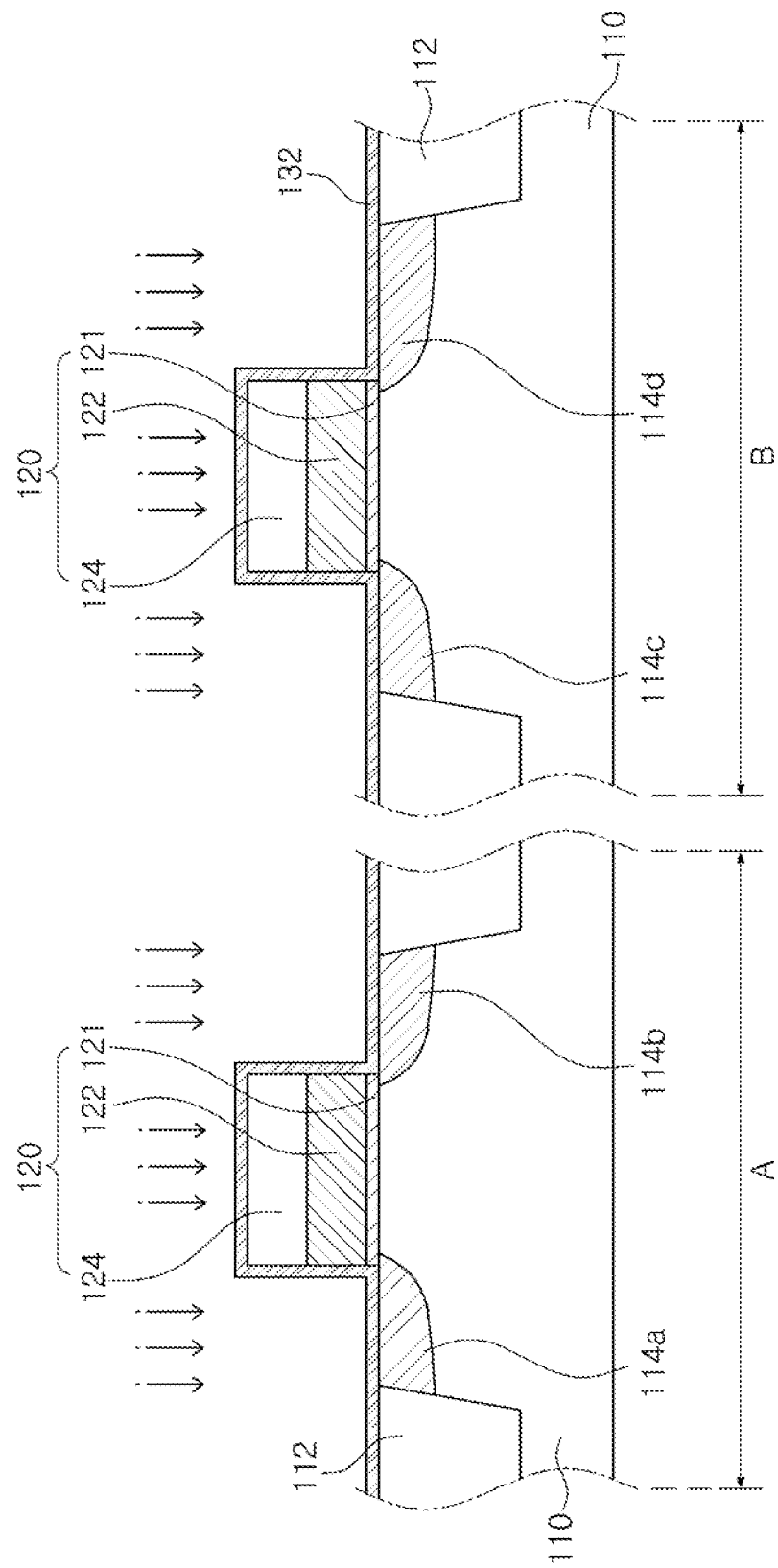

Referring to FIG. 4B, the buffer insulating layer 132 may be formed on the entire surface of the substrate 110 having the gate structures 120.

The buffer insulating layer 132 may be formed in order to reduce damage occurring in the substrate 110 during a subsequent ion implantation process. Ions of low-concentration impurities may be implanted into portions of the substrate 110 adjacent to the gate structures 120, using the gate structures 120 as masks. Through such an ion implantation process, source and drain regions 114a, 114b, 114c and 114d at a low concentration may be formed and self-aligned in portions of the substrate 110 adjacent to the gate structures 120. Depending on example embodiments, the low-concentration impurities may be N-type impurities, for example, phosphorus (P).

Figure 4C:
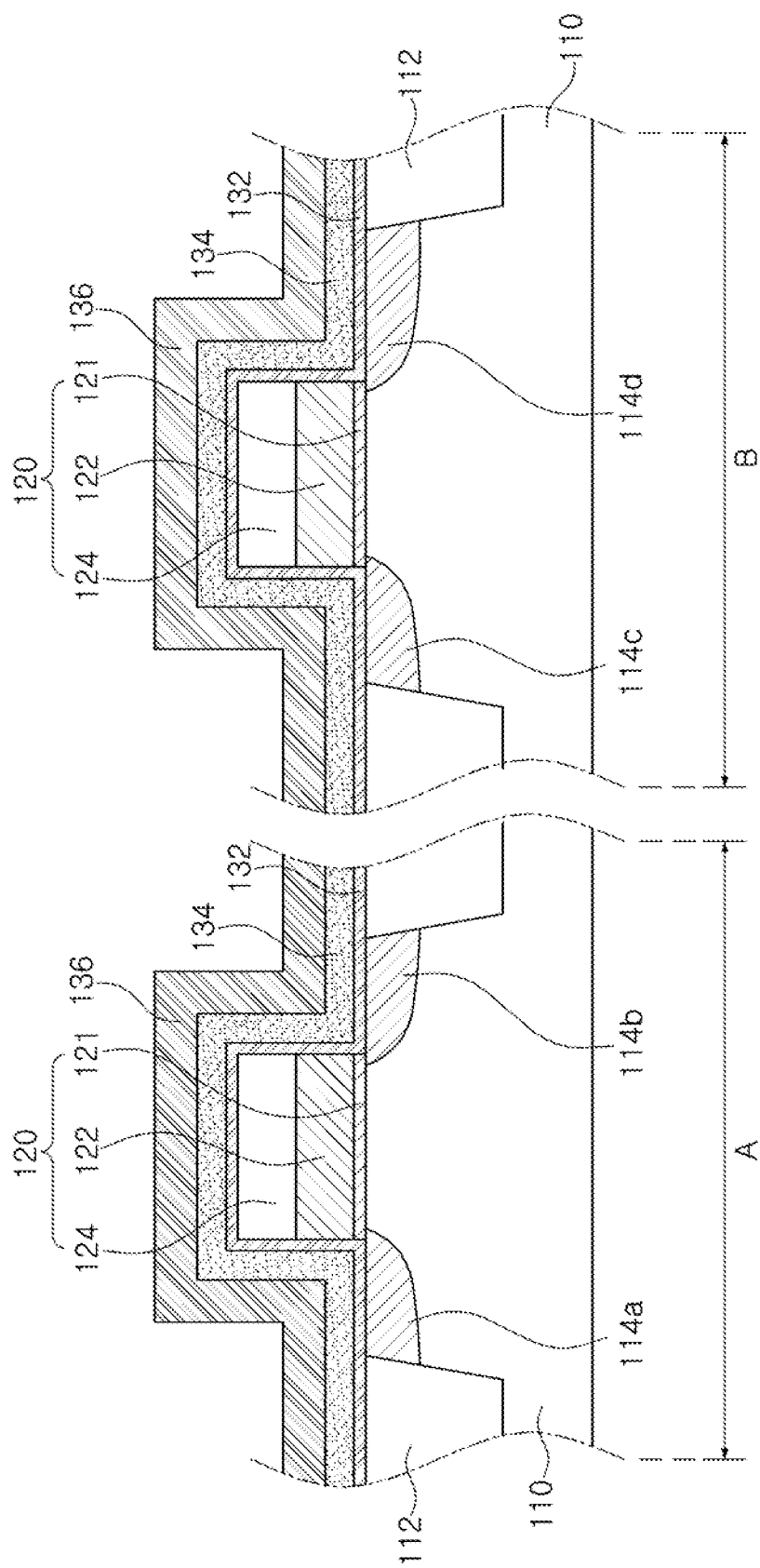

Referring to FIG. 4C, a first insulating layer 134 and a second insulating layer 136 may be sequentially formed on the buffer insulating layer 132 formed on the entire surface of the substrate 110 having the gate structures 120.

In this case, the second insulating layer 136 may be thicker than the first insulating layer 134. The first insulating layer 134 and the second insulating layer 136 may be formed by, for example, a chemical vapor deposition method or an atomic layer deposition method. The first insulating layer 134 and the second insulating layer 136 may be formed of materials having etch selectivity with respect to each other. For example, the first insulating layer 134 may be a silicon oxide layer and the second insulating layer 136 may be a silicon nitride layer.

Figure 4D:
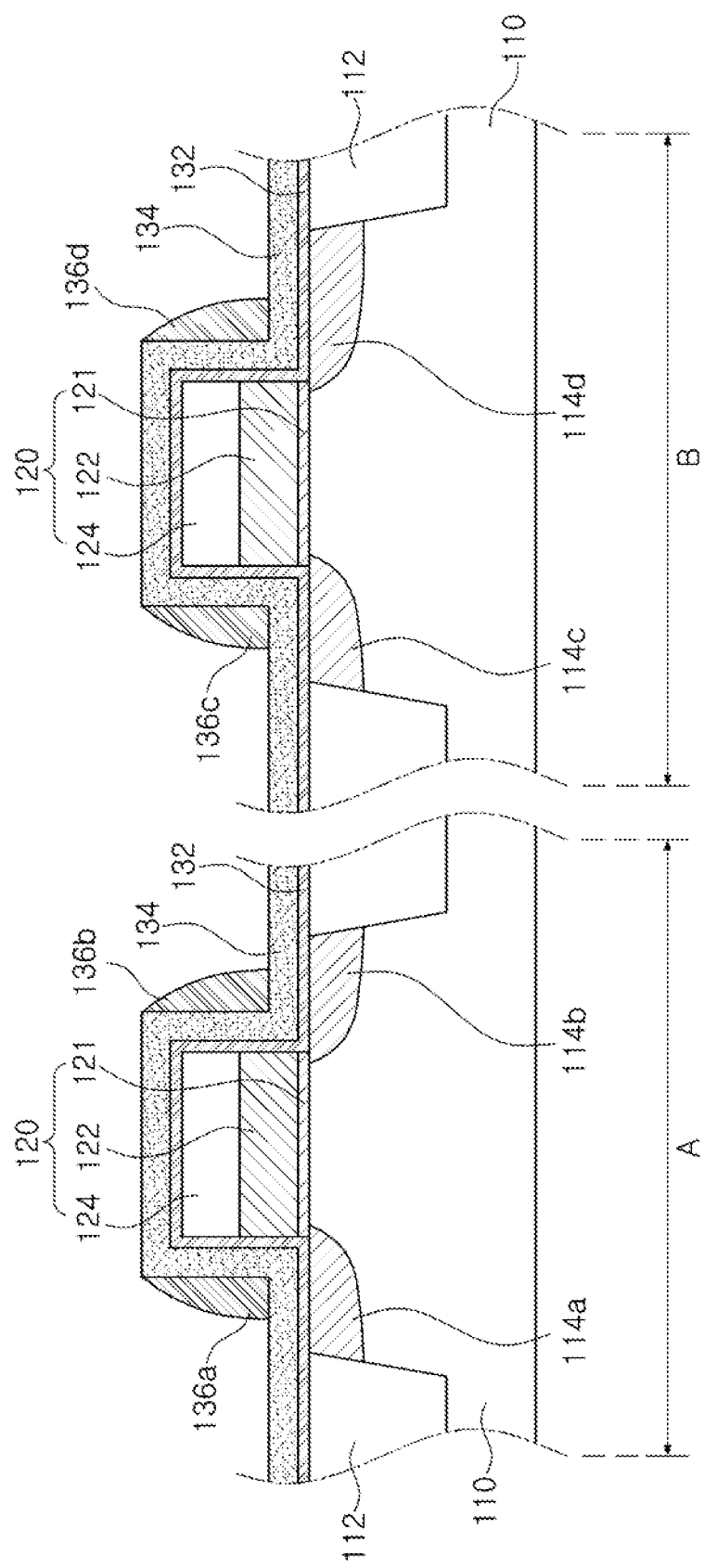

Referring to FIG. 4D, the second insulating layer 136 formed on the entire surface of the substrate 110 may be, for example, dry-etched to form the second spacer insulating layers 136a, 136b, 136c and 136d at the sides of the gate structures 120.

In this case, the first insulating layer 134 disposed on a lower portion of the second insulating layer 136 may be used as an etching stopping layer.

Figure 4E:
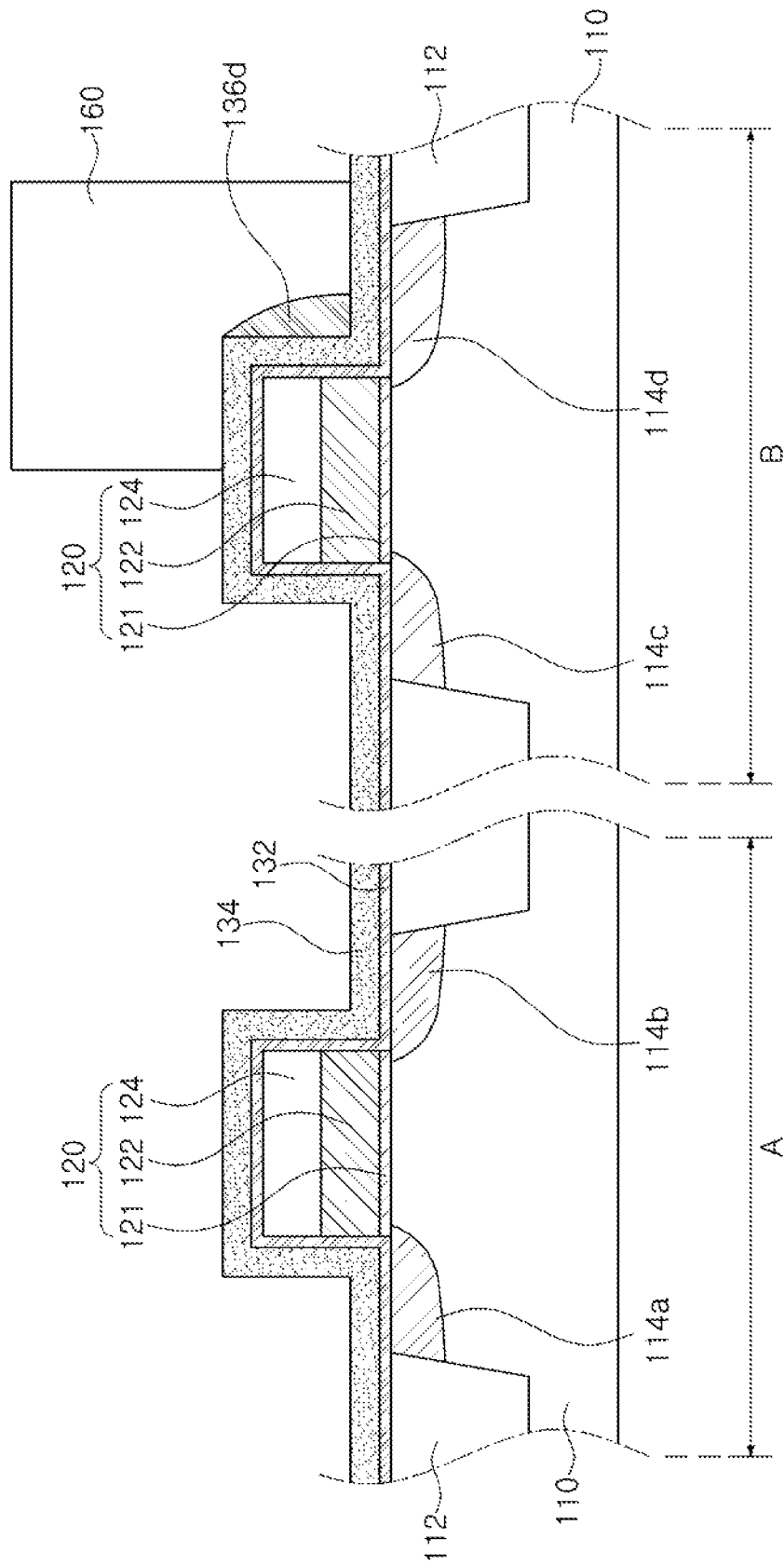

Referring to FIG. 4E, the remaining second spacer insulating layers 136a, 136b, and 136c except for the second spacer insulating layer 136d disposed on one side of the gate structure 120 in the input/output circuit area B may be removed (e.g., etched) using a photoresist pattern 160 as a mask.

For example, photoresist is applied to the entire surface of the substrate 110 having the gate structures 120. Subsequently, the photoresist may be patterned, using an exposure and development process, to form the photoresist pattern 160, which covers the second spacer insulating layer 136d disposed on one side of the gate structure 120 in the input/output circuit area B. Accordingly, the second spacer insulating layer 136c disposed on the other side of the gate structure 120 in the input/output circuit area B, and the second spacer insulating layers 136a and 136b formed at both side of the gate structure 120 in the core circuit area A may be removed using the photoresist pattern 160 as an etching mask. For example, the second spacer insulating layers 136a, 136b, and 136c may be removed through a wet etching process, using the photoresist pattern 160 as an etching mask.

Figure 4F:
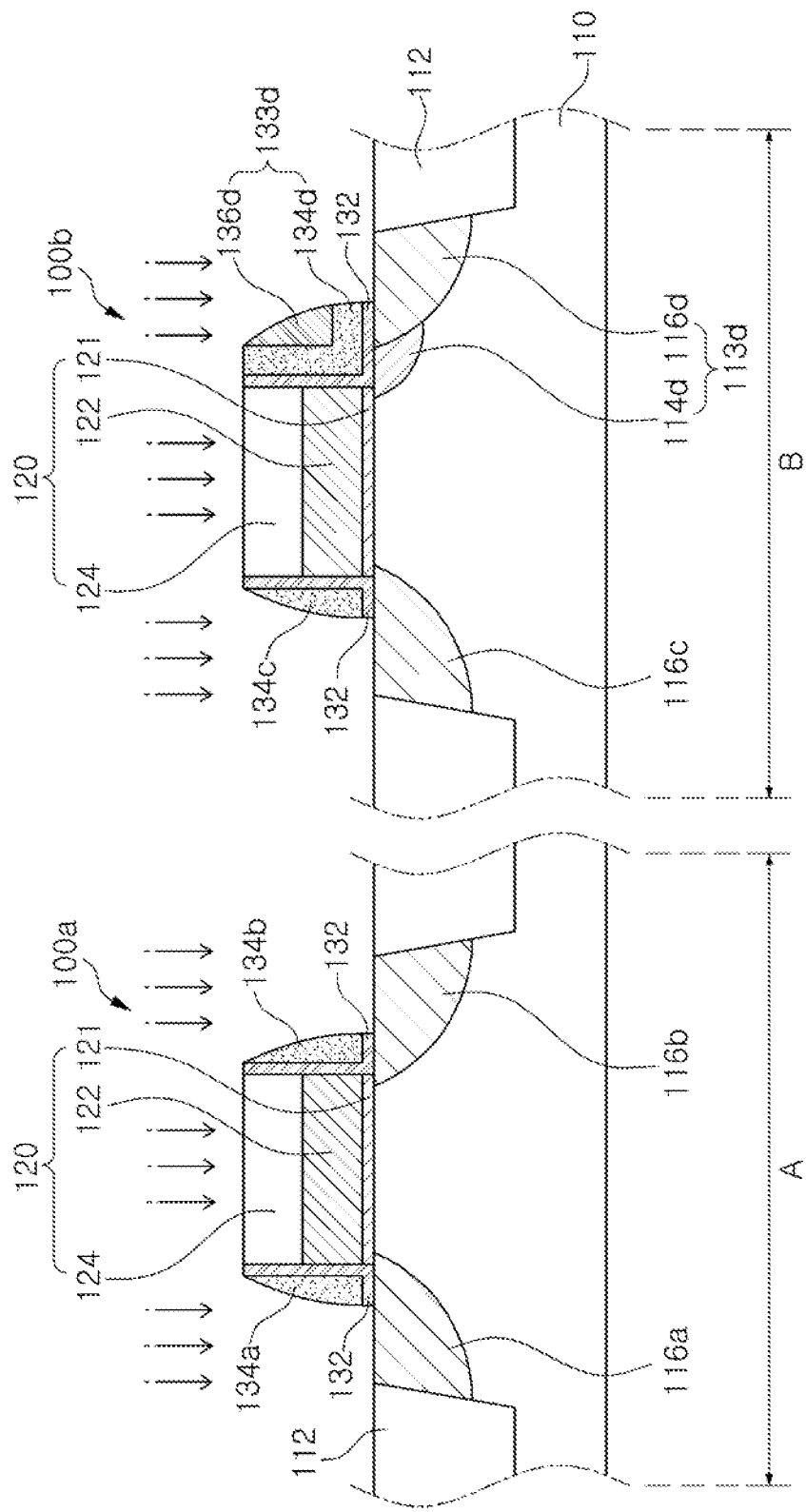

Referring to FIG. 4F, the spacers 134a, 134b, 134c and 133d may be formed at the side of the gate structures 120 disposed on the substrate 110, and impurity ions may be implanted in a relatively high concentration into portions of the substrate 110 adjacent to the spacers 134a, 134b, 134c and 133d.

For example, the photoresist pattern 160 formed to cover the second spacer insulating layer 136d formed at one side of the gate structure 120 in the input/output circuit area B may be removed through asking and/or stripping processes.

Thus, the second spacer insulating layer 136d formed at one side surface of the gate structure 120 disposed in the input/output circuit area B may be exposed, and the remaining portions of the first insulating layer 134 formed on the substrate 110 and the gate structures 120 in the core circuit area A and the input/output circuit area B, except for a portion of the first insulating layer 134 covered with the second spacer insulating layer 136d, may be exposed. The exposed first insulating layer 134 may be, for example, dry-etched to form the spacers 134a, 134b, 134c and 134d at the side surfaces of the gate structure 120. Thus, in the portion of the first insulating layer 134 covered with the second spacer insulating layer 136d, the first spacer insulating layer 134d having an L-shaped cross-section may be formed. In such a process, the asymmetrical spacers 133d and 134c with different thicknesses at both sides of the gate structure 120 may be formed in the input/output circuit area B. That is, the first spacer 133d having a dual spacer structure including the first spacer insulating layer 134d having an L-shaped cross-section and the second spacer insulating layer 136d may be formed at one side of the gate structure 120, and the second spacer 134c having a single spacer structure may be formed at the other side of the gate structure 120. Unlike this, the symmetrical spacers 134a and 134b having a same thickness at both sides of the gate structure 120 may be formed in the core circuit area A. That is, the third and fourth spacers 134a and 134b, which have a single spacer insulating layer, may be formed at both sides of the gate structure 120, respectively.

Then, impurity ions may be implanted in a relatively high concentration into portions of the substrate 110 adjacent to the spacers 134a, 134b, 134c and 133d, using the gate structures 120 and the spacers 134a, 134b, 134c and 133d as masks. Depending on example embodiments, the high concentration impurities may be N-type impurities, for example, arsenic (As). Through such an ion implantation process, the source regions 116a and 116c, and the drain regions 116b and 116d that are self-aligned and having a relatively high concentration may be formed in portions of the substrate 110 adjacent to the spacers 134a, 134b, 134c and 133d. Accordingly, the asymmetrical transistor 100b including the source region and the drain region asymmetrically disposed with respect to the gate structure 120 may be formed in the input/output circuit area B. That is, the source region 116c may be a single region doped with impurities having a relatively high concentration, and the drain region 113d may include a double region including the first drain region 114d and the second drain region 116d doped with impurities having a relatively higher concentration than the first drain region 114d.

For example, the symmetrical transistor 100a including the source region 116a and the drain region 116b symmetrically disposed with respect to the gate structure 120, may be formed in the core circuit area A.

Figure 5A:
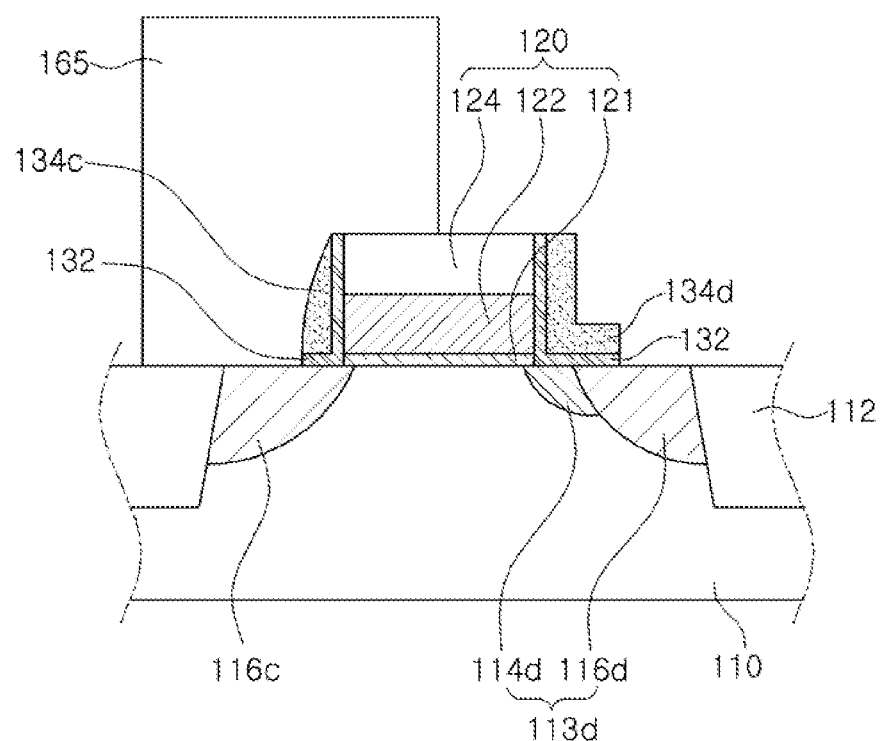
FIGS. 5A and 5B are views illustrating a method of manufacturing transistors according to another example embodiment of the present disclosure.
Figure 5B:
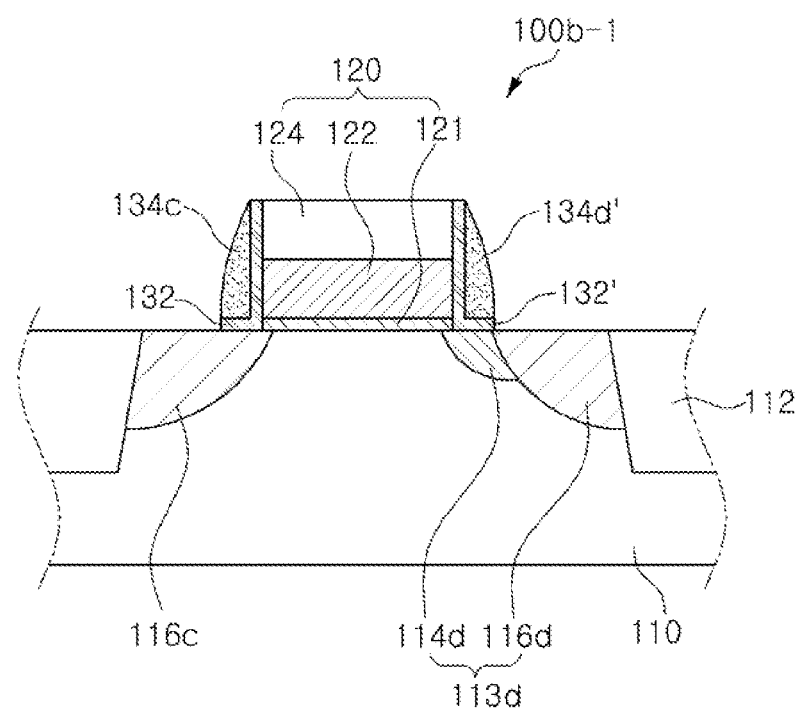

FIGS. 5A and 5B are views illustrating a method of manufacturing transistors according to another example embodiment of the present disclosure.

Referring to FIGS. 5A and 5B, in the case of the asymmetrical transistor 100b illustrated in FIG. 4F, the second spacer insulating layer 136d disposed on one side of the gate structure 120 may be removed to form a first spacer 134d'.

For example, photoresist may be applied to the entire surface of the substrate 110 on which the symmetrical transistor 100a and the asymmetrical transistor 100b may be disposed. A photoresist pattern 165 may be formed to expose the first spacer 133d disposed on one side of the gate structure 120 of the asymmetrical transistor 100b. The second spacer insulating layer 136d may be removed through, for example, a wet etching process, using the photoresist pattern 165 as an etching mask. Subsequently, the first spacer insulating layer 134d and the buffer insulating layer 132 may be etched through, for example, a dry etching method to form the first spacer 134d' having a single spacer structure.

An asymmetrical transistor 100b-1 formed by a method according to the foregoing example embodiment of the present disclosure may include the source and drain regions 116c and 113d that are asymmetrical with respect to the gate structure 120, and may include spacers 134c and 134d' formed at both side of the gate structure 120 and having a single symmetric structure with respect to the gate structure 120.

Figure 6:
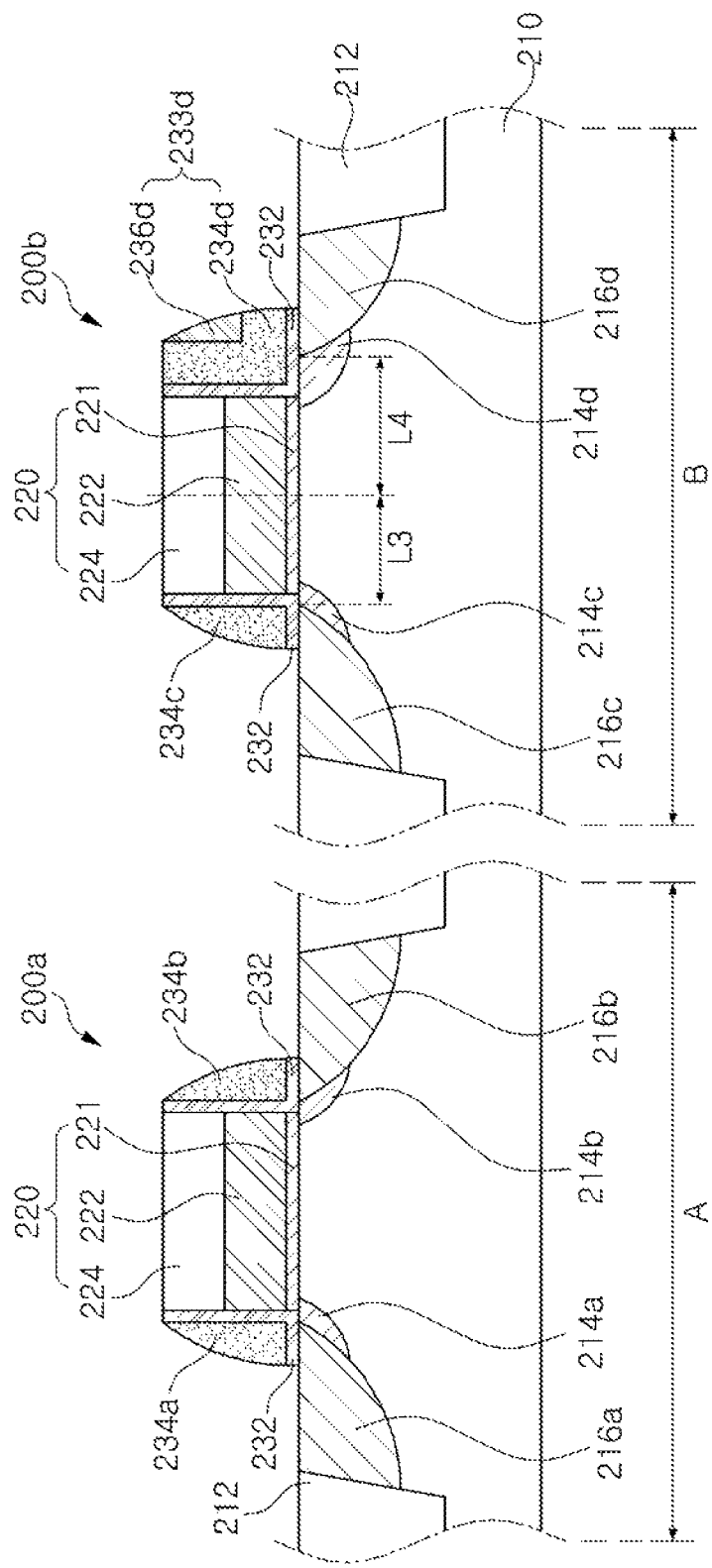
FIG. 6 is cross-sectional views of a pair of transistors according to another example embodiment in the present disclosure.

FIG. 6 is cross-sectional views of a pair of transistors according to another example embodiment of the present disclosure.

Referring to FIG. 6, a symmetrical transistor 200a and an asymmetrical transistor 200b having spacer structures partially modified from those of the symmetrical transistor 100a and the asymmetrical transistor 100b of FIG. 3 are illustrated.

Spacers 234a and 234b of the symmetrical transistor 200a disposed in the core circuit region A may have thicknesses greater than those of the spacers 134a and 134b of the symmetrical transistor 100a illustrated in FIG. 3. The symmetrical transistor 200a may include source regions 214a and 216a and drain regions 214b and 216b that are symmetrical with respect to a gate structure 220. The regions 214a and 214b may be doped with impurities having a relatively low concentration and the regions 216a and 216b may be doped with impurities having a relatively high concentration.

The asymmetrical transistor 200b disposed in the input/output circuit region B may include spacers 234c and 234d. The spacers 234c and 234d may have thicknesses greater than those of the spacers 134c and 134d of the asymmetrical transistor 100b illustrated in FIG. 3. Meanwhile, a thickness of a second spacer insulating layer 236d may be smaller than that of the second spacer insulating layer 136d of the asymmetrical transistor 100b illustrated in FIG. 3. The asymmetrical transistor 200b may include source regions 214c and 216c and drain regions 214d and 216d that are asymmetrically disposed with respect to the gate structure 220. The source regions 214c and 216c may include a first source region 214c and a second source region 216c doped with impurities at a level of a concentration greater than that of the first source region 214c. The drain regions 214d and 216d may include a first drain region 214d and a second drain region 216d doped with impurities at a level of a concentration greater than that of the first drain region 214d. A distance L4 from a central axis of the gate structure 220 to the second drain region 216d may be greater than a distance L3 from the central axis of the gate structure 120 to the second source region 216c.

The symmetrical transistor 200a and the asymmetrical transistor 200b described with reference to FIG. 6 may be manufactured by the same method as the manufacturing method described with reference to FIGS. 4A through 4F, with the exception that a thickness of a first insulating layer 234 is increased while a thickness of a second insulating layer 236 is reduced. A total thickness of the first insulating layer 234 and the second insulating layer 236 may be maintained to be the same as the total thickness of the first insulating layer 134 and the second insulating layer 136, as illustrated in FIG. 4C. Therefore, a first spacer 233d of the asymmetrical transistor 200b may have the same thickness as the first spacer 133d of the asymmetrical transistor 100b illustrated in FIG. 4F.

Figure 7A:
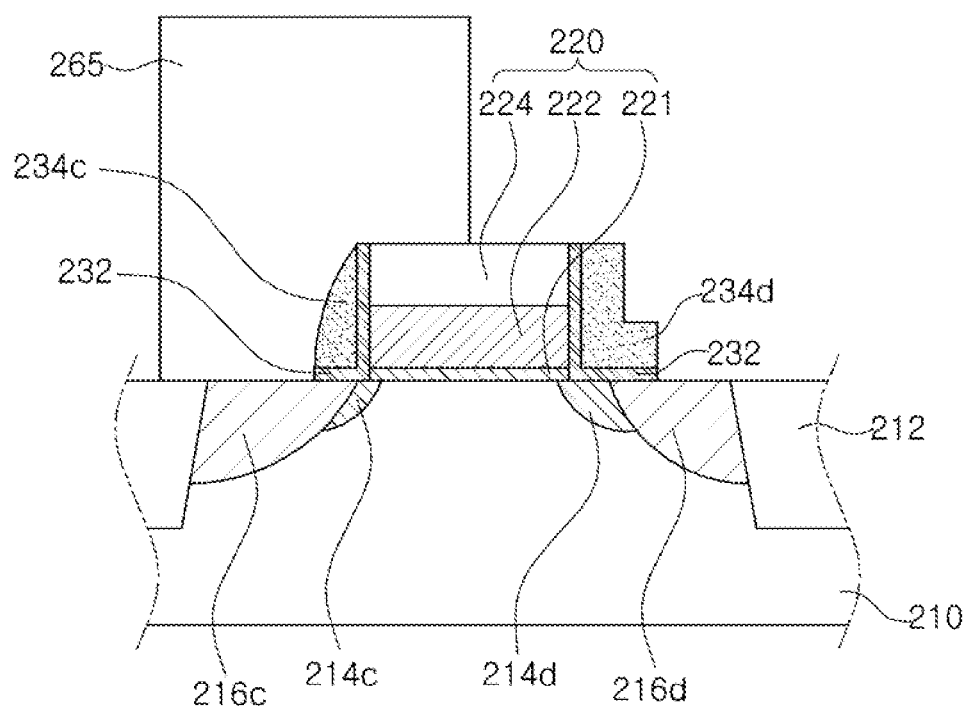
FIGS. 7A and 7B are views illustrating a method of manufacturing transistors according to still another example embodiment in the present disclosure.
Figure 7B:
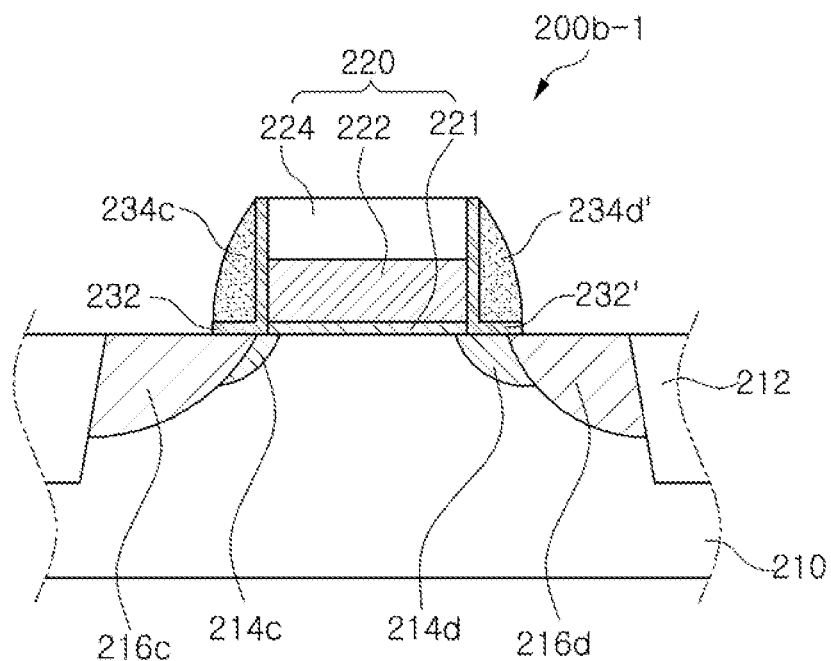

FIGS. 7A and 7B are views illustrating a method of manufacturing transistors according to still another example embodiment of the present disclosure.

Referring to FIGS. 7A and 7B, the manufacturing method described with reference to FIGS. 5A and 5B may be applied to the asymmetrical transistor 200b illustrated in FIG. 6. Unlike the structure of the asymmetrical transistor 200b illustrated in FIG. 6, an asymmetrical transistor 200b-1 according to an example embodiment of the present disclosure may include spacers 234c and 234d' having single spacer structures and symmetrically disposed on both side of the gate structure 220. Because the remaining constitutions of the asymmetrical transistor 200b-1 are identical to those of the asymmetrical transistor 200b, repeated explanations will be omitted.

Figure 8:
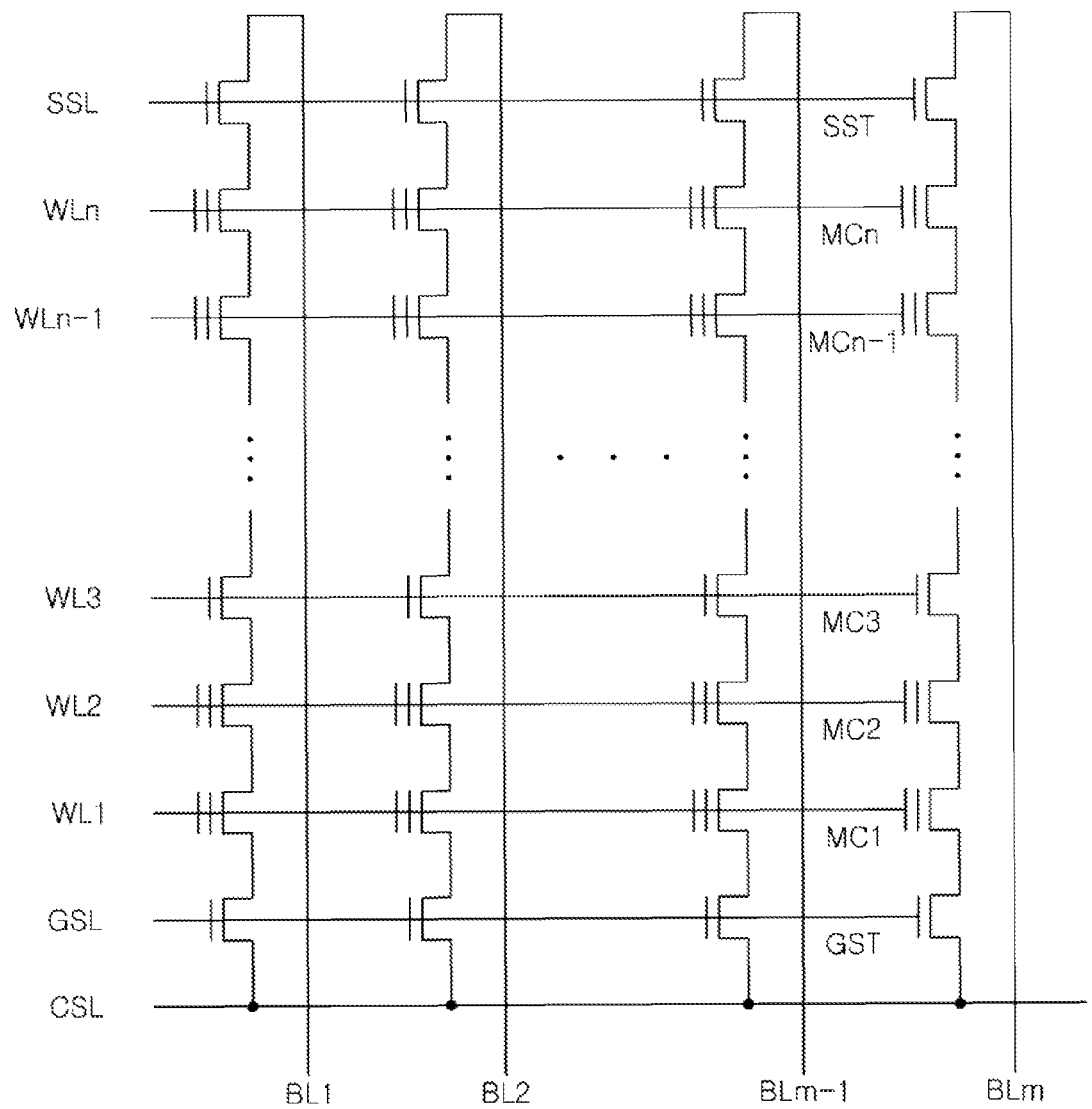
FIG. 8 is a circuit diagram of a cell array in a non-volatile memory device according to an example embodiment in the present disclosure.

FIG. 8 is a partial circuit diagram of a cell array in a non-volatile memory device according to an example embodiment of the present disclosure.

Referring to FIG. 8, the non-volatile memory device according to an example embodiment of the present disclosure is a NAND flash memory device.

A cell array 400A may be configured of a plurality of cell blocks and each of the cell blocks may be configured of a plurality of pages. Each of the pages may be configured of a plurality of memory cell elements, which is connected to a single word line. Meanwhile, each of the cell blocks may be configured of a plurality of cell strings. Each of the cell strings may include a string selection transistor SST connected to a string selection line SSL, the plurality of memory cell elements MC1 to MCn connected to a plurality of word lines WL1 to WLn, respectively, and a ground selection transistor GST connected to a ground selection line GSL. The string selection transistor SST may be connected to a bit line BL and the ground selection transistor GST may be connected to a common source line CSL. The plurality of memory cell elements MC1 to MCn may be connected to one another in series between the bit line BL and the common source line CSL.

Figure 9:
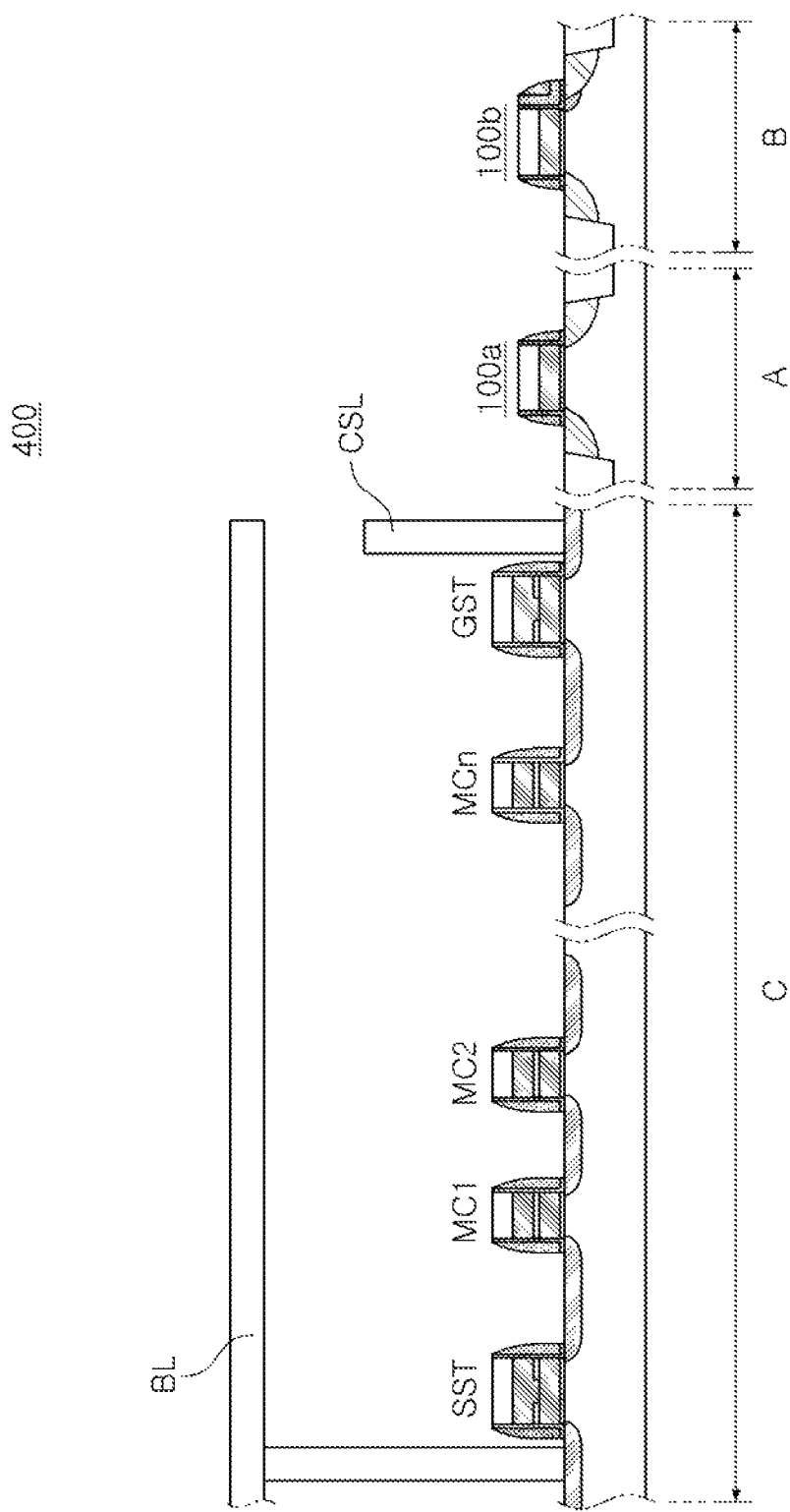
FIG. 9 is a cross-sectional view of a non-volatile memory device according to an example embodiment in the present disclosure.

FIG. 9 is a cross-sectional view of a non-volatile memory device according to an example embodiment of the present disclosure.

Referring to FIG. 9, the non-volatile memory device according to an example embodiment of the present disclosure is a NAND flash memory device.

A NAND flash memory device 400 may include a cell array area C, a core circuit area A, and an input/output circuit area B. The memory cell elements and transistors in the respective areas are illustrated for understanding of an example embodiment of the present disclosure, and relative sizes of the memory cell elements and the transistors are not limited to the illustrated example embodiment.

A plurality of cell strings may be repeatedly disposed within the cell array area C, and a structure of a single cell string (e.g., a portion of the plurality of cell strings) is illustrated. The single cell string may include a string selection transistor SST connected to a bit line BL, a ground selection transistor GST connected to a common source line CSL, and a plurality of memory cells MC1 to MCn disposed between the string selection transistor SST and the ground selection transistor GST. Each of the memory cells MCs may include a tunnel insulating layer formed on a substrate, a floating gate, a blocking insulating layer, and a control gate. Each of the string selection transistor SST and the ground selection transistor GST may include a gate insulating layer formed on the substrate, a lower conductive layer, a blocking insulating layer, and an upper conductive layer. A portion of the blocking insulating layer may be removed to electrically connect the upper conductive layer with the lower conductive layer.

Substrate regions between the memory cells MCs, a substrate region between the string selection transistor SST and the memory cell MC1 adjacent to the string selection transistor SST, and a substrate region between the ground selection transistor GST and the memory cell MCn adjacent to the ground selection transistor GST may be regions doped with impurities.

The symmetrical transistor 100a described with reference to, for example, FIG. 3 may be disposed in the core circuit area A, and the asymmetrical transistor 100b described with reference to, for example, FIG. 3 may be disposed in the input/output circuit area B. However, example embodiments of the present disclosure are not limited thereto. The symmetrical transistor 200a described with reference to FIG. 6 may be disposed in the core circuit area A, and the asymmetrical transistor 200b described with reference to FIG. 6 may be disposed in the input/output circuit area B. Further, the asymmetrical transistor 100b-1 or 200b-1 illustrated in FIG. 5B or FIG. 7B may be disposed in the input/output circuit area B. Depending on example embodiments, the asymmetrical transistor 100b, 100b-1, 200b or 200b-1 illustrated in FIGS. 3 and 5-7 may be disposed in a peripheral circuit area including the core circuit area A and the input/output circuit area B.

Figure 10:
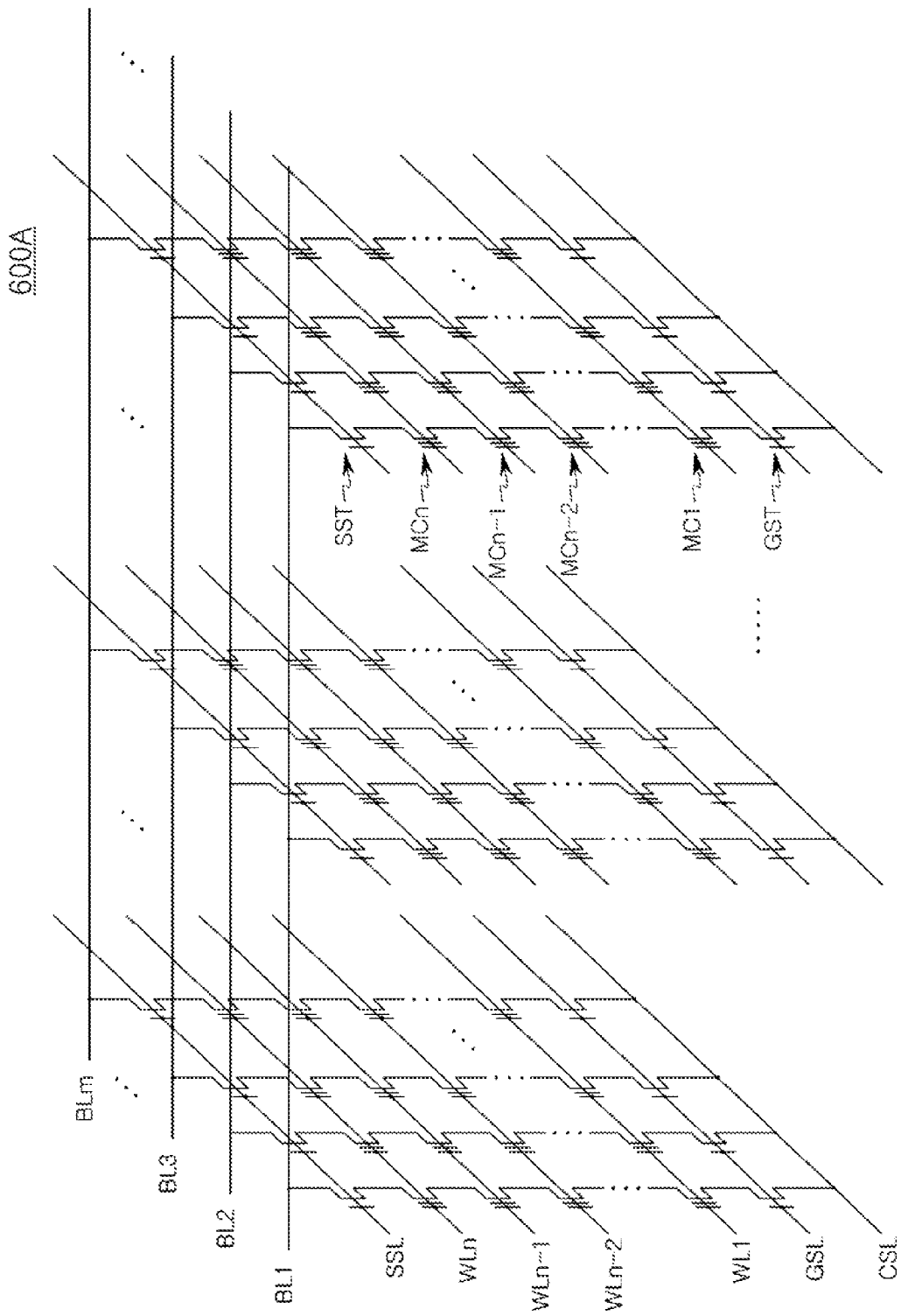
FIG. 10 is a circuit diagram of a cell array in a non-volatile memory device according to an example embodiment in the present disclosure.

FIG. 10 is a circuit diagram of a cell array in a non-volatile memory device according to an example embodiment of the present disclosure.

Referring to FIG. 10, the non-volatile memory device according to an example embodiment of the present disclosure is a vertical-type NAND flash memory device.

A cell array 600A of the vertical-type NAND flash memory device may include a plurality of memory cell strings respectively including N number of memory cell elements MC1 to MCn, and a ground selection transistor GST and a string selection transistor SST. The ground selection transistor GST and the string selection transistor SST may be connected in series to respective ends of a memory cell string (which includes the memory cell elements MC1 to MCn connected to one another in series).

The N number of memory cell elements MC1 to MCn connected to one another in series may be connected to respective word lines WL1 to WLn provided to select at least a portion of the memory cell elements MC1 to MCn.

A gate terminal of the ground selection transistor GST may be connected to a ground selection line GSL and a source terminal thereof may be connected to a common source line CSL. Meanwhile, a gate terminal of the string selection transistor SST may be connected to a string selection line SSL and a source terminal thereof may be connected to a drain terminal of the memory cell element MCn. FIG. 10 illustrates a structure in which a single ground selection transistor GST and a single string selection transistor SST are connected to the N number of memory cell elements MC1 to MCn connected to one another in series. However, example embodiments are not limited thereto. For example, a plurality of ground selection transistors GSTs or a plurality of string selection transistors SSTs may be connected to the memory cell elements MC1 to MCn.

A drain terminal of the string selection transistor SST may be connected to bit lines BL1 to BLm. When a signal is applied to the gate terminal of the string selection transistor SST through a string selection line SSL, the signal applied through the bit lines BL1 to BLm may be transferred to the N number of memory cell elements MC1 to MCn connected to one another in series such that a data reading or writing operation may be performed. Further, when a signal is applied to the gate terminal of the ground selection transistor GST having a source terminal connected to the common source line CSL through a ground selection line GSL, an erase operation of removing all charges stored in the N number of memory cell elements MC1 to MCn may be undertaken.

Figure 11:
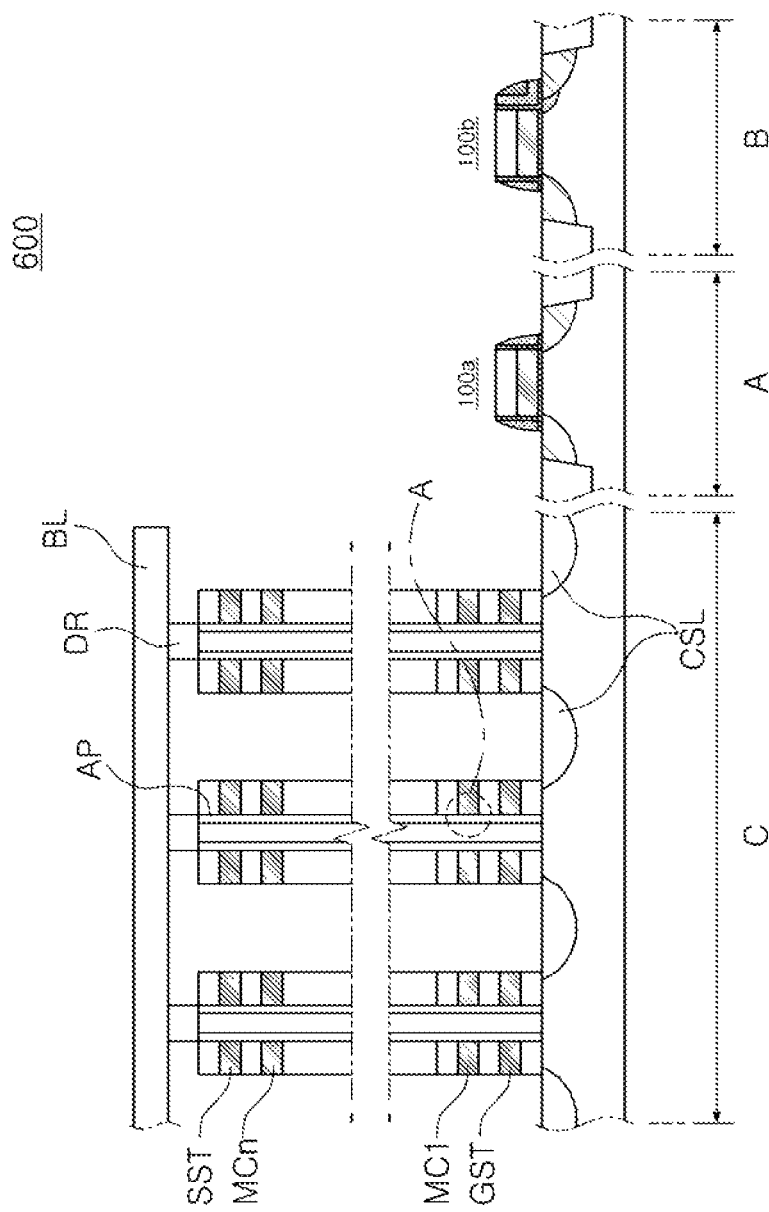
FIG. 11 is a cross-sectional view of a non-volatile memory device according to an example embodiment in the present disclosure.

FIG. 11 is a cross-sectional view of a non-volatile memory device according to an example embodiment of the present disclosure.

Referring to FIG. 11, the non-volatile memory device according to an example embodiment of the present disclosure is a vertical-type NAND flash memory device.

A vertical-type NAND flash memory device 600 may include a cell array area C, a core circuit area A, and an input/output circuit area B.

The cell array area C may include a plurality of active pillars APs formed on a substrate to be perpendicular thereto. The cell array area C may include ground selection transistors GSTs, memory cell elements MC1 to MCn, and string selection transistors SSTs that are stacked along outer sidewalls of the active pillars APs. Each of the active pillars APs may include a buried insulating layer, a channel region, and a gate dielectric layer. The structure of the active pillar AP will be described in detail with reference to FIGS. 12 and 13. Cell gate electrodes of the ground selection transistor GST, the memory cell elements MC1 to MCn, and the string selection transistor SST may be formed of the same material, for example, polysilicon or a metal film doped with impurities. Although not illustrated, cell gate electrodes of the ground selection transistor GST, the memory cell elements MC1 to MCn, and the string selection transistor SST may be extended in parallel in one direction to form a ground selection line GSL, word lines WL, and a string selection line SSL, respectively. The ground selection line GSL, the word lines WLs, and the string selection line SSL may be disposed to intersect with the plurality of active pillars AP. Interlayer insulating layers may be disposed between the ground selection line GSL, word lines WL1 to WLn, and the string selection line SSL. The active pillars APs may include drain regions DRs in top portions thereof and be connected to a bit line BL. A common source line CSL may be disposed in substrate regions between the active pillars AP and may be formed by doping with impurities. Although not illustrated, a separation insulating layer may be formed on the common source line CSL. The configuration of the cell array area C is schematically illustrated to help in gaining an understanding of some example embodiments of the present disclosure, and example embodiments of the present disclosure are not limited thereto.

The symmetrical transistor 100a described with reference to, for example, FIG. 3 may be disposed in the core circuit area A, and the asymmetrical transistor 100b described with reference to, for example, FIG. 3 may be disposed in the input/output circuit area B. However, example embodiments of the present disclosure are not limited thereto. The symmetrical transistor 200a described with reference to FIG. 6 may be disposed in the core circuit area A, and the asymmetrical transistor 200b described with reference to FIG. 6 may be disposed in the input/output circuit area B. Further, the asymmetrical transistor 100b-1 or 200b-1 illustrated in FIG. 5B or FIG. 7B may be disposed in the input/output circuit area B. Depending on example embodiments, the asymmetrical transistor 100b, 100b-1, 200b or 200b-1 illustrated in FIGS. 3 and 5-7 may be disposed in the peripheral circuit area including the core circuit area A and the input/output circuit area B.

Figure 12:
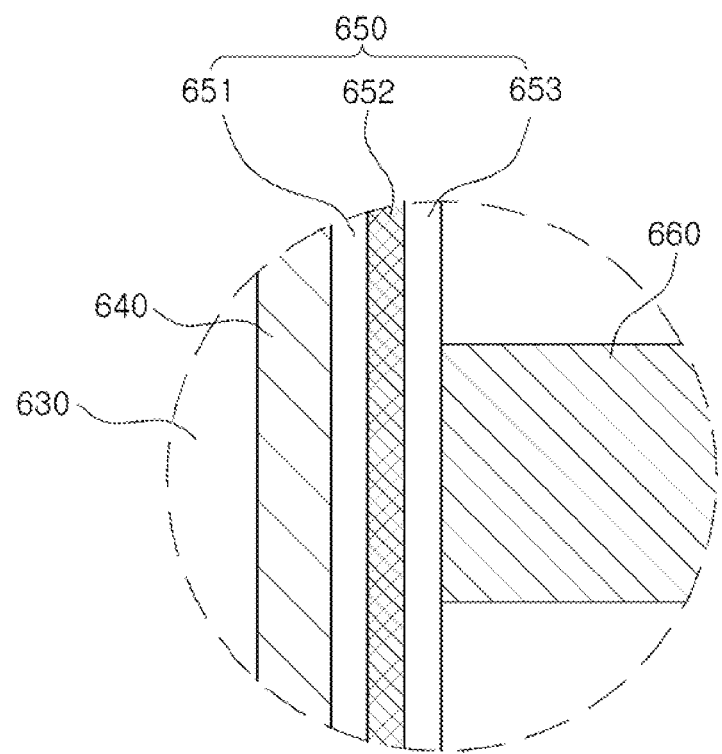
FIGS. 12 and 13 are enlarged cross-sectional views of region A of FIG. 11.
Figure 13:
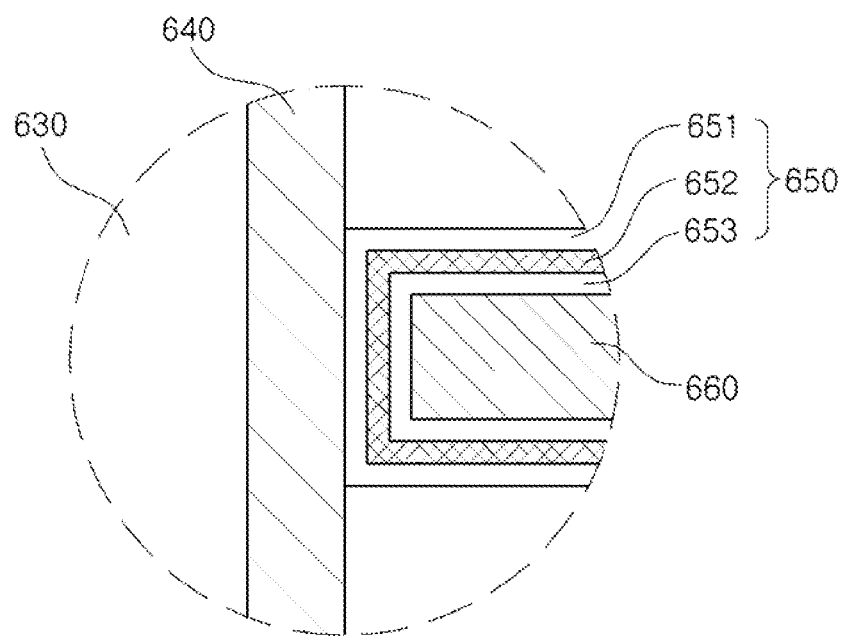

FIGS. 12 and 13 are enlarged cross-sectional views of region A of FIG. 11.

Referring to FIG. 12, the active pillar AP includes a buried insulating layer 630, a channel region 640, and a gate dielectric layer 650, sequentially disposed from the interior thereof. The gate dielectric layer 650 may include a tunneling layer 651, a charge storage layer 652, and a blocking layer 653. Relative thicknesses of the layers constituting the gate dielectric layer 650 are not limited to those illustrated in FIG. 12, and may be variously changed. A plurality of cell gate electrodes 660 may be disposed in the outer side of the active pillar AP so as to contact the blocking layer 653. Although not illustrated, interlayer insulating layers may be disposed between the plurality of cell gate electrodes 660.

The channel region 640 may contain a semiconductor material, for example, polysilicon or single crystalline silicon, and the semiconductor material may be, for example, an undoped material or a material containing p-type or n-type impurities.

The tunneling layer 651 may include, for example, at least one of silicon oxide ($SiO_2$), silicon nitride ($Si_3N_4$), silicon oxynitride (SiON), hafnium oxide ($HfO_2$), and hafnium silicon oxide ($HfSi_xO_y$).

The charge storage layer 652 may be a charge-trapping layer or a floating gate conductive layer. In a case in which the charge storage layer 652 is a floating gate conductive layer, it may be formed by, for example, depositing a polysilicon layer through low-pressure chemical vapor deposition (LPCVD). In a case in which the charge storage layer 652 is a charge-trapping layer, it may contain, for example, at least one of silicon oxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), tantalum hafnium oxide ($HfTa_xO_y$), hafnium silicon oxide ($HfSi_xO_y$), aluminum nitride ($Al_xN_y$), and aluminum gallium nitride ($AlGa_xN_y$).

The blocking layer 653 may contain, for example, at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The cell gate electrodes 660 may contain, for example, a polysilicon material or a metal silicide material. The metal silicide material may be, for example, a silicide material of a metal selected from among Co, Ni, Hf, Pt, W and Ti. Depending on example embodiments, the gate electrodes 660 may contain a metal, for example, tungsten (W). Further, although not illustrated, the gate electrodes 660 may include diffusion barriers, which may contain, for example, at least one of tungsten nitride (WN), tantalum nitride (TaN), and titanium nitride (TiN).

Interlayer insulating layers may contain an insulating material, for example, silicon oxide or silicon nitride.

Referring to FIG. 13, the active pillar AP includes the buried insulating layer 630 and the channel region 640 sequentially disposed from the interior thereof. The tunneling layer 651, the charge storage layer 652, the blocking layer 653 and the cell gate electrode 660 may be sequentially disposed at the outer side of the active pillar AP so as to contact the channel region 640. Because materials forming the respective layers are identical to those described above with reference to FIG. 12, the description thereof will be omitted.

Depending on example embodiments, the blocking layer 653 may be disposed in a circumferential portion of the cell gate electrode 660 as illustrated in FIG. 13, and the tunneling layer 651 and the charge storage layer 652 may be disposed in the active pillar AP and extended along the channel region 640 in a vertical direction, as illustrated in FIG. 12.

Figure 14:
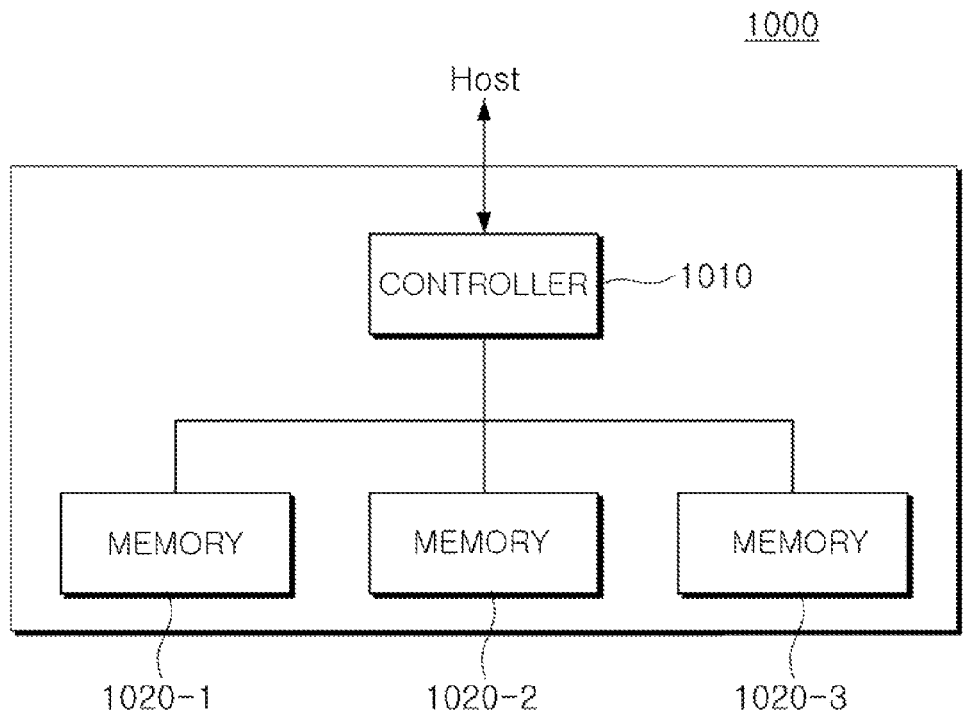
FIG. 14 is a block diagram illustrating a storage device including a non-volatile memory device according to an example embodiment in the present disclosure.

FIG. 14 is a block diagram illustrating a storage device including a non-volatile memory device according to an example embodiment of the present disclosure.

Referring to FIG. 14, a storage device 1000 according to an example embodiment of the present disclosure includes a controller 1010 communicating with a Host, and memories 1020-1, 1020-2 and 1020-3 storing data. Each of the memories 1020-1, 1020-2 and 1020-3 may include the non-volatile memory device according to various example embodiments of the present disclosure described with reference to FIGS. 1 to 13.

Examples of the Host communicating with the controller 1010 may include various electronic devices on which the storage device 1000 is mounted. For example, the Host may be, for example, a smartphone, a digital camera, a desk top computer, a lap top computer, a portable media player or the like. The controller 1010 may receive a data writing or reading request transferred from the Host to store data in the memories 1020-1, 1020-2 and 1020-3 or generate a command (CMD) for fetching data from the memories 1020-1, 1020-2 and 1020-3.

As illustrated in FIG. 14, at least one or more memories 1020-1, 1020-2 and 1020-3 may be connected to the controller 1010 in parallel in the storage device 1000. The plurality of memories 1020-1, 1020-2 and 1020-3 may be connected to the controller 1010 in parallel, whereby the storage device 1000 having high capacity such as a solid state drive may be implemented.

Figure 15:
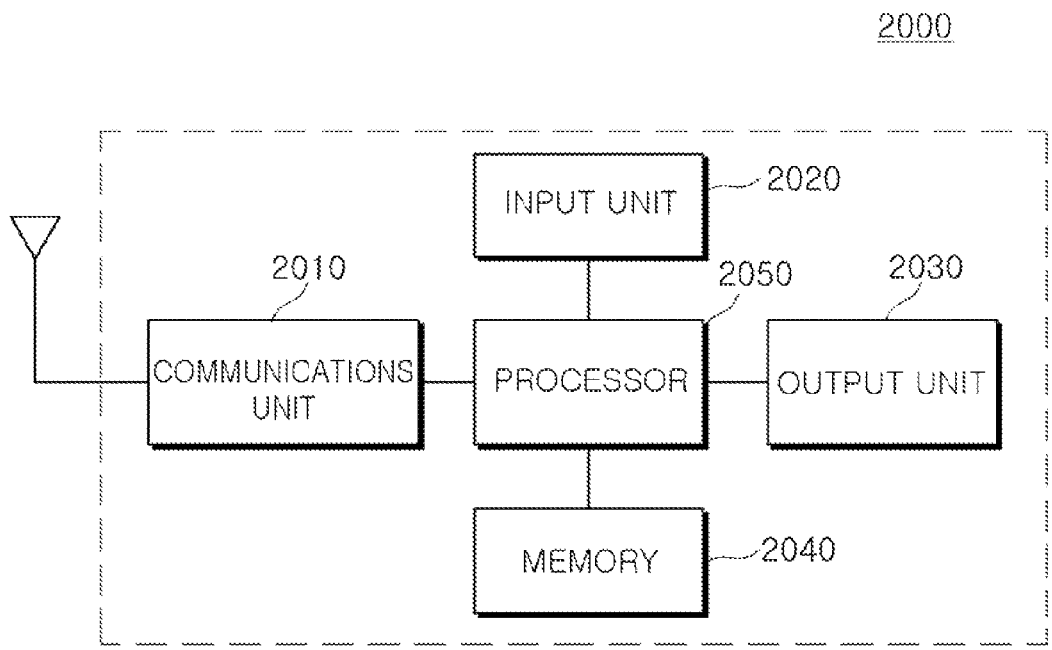
FIG. 15 is a block diagram illustrating an electronic device including a non-volatile memory device according to an example embodiment in the present disclosure.

FIG. 15 is a block diagram illustrating an electronic device including a non-volatile memory device according to an example embodiment of the present disclosure.

Referring to FIG. 15, an electronic device 2000 according to the example embodiment includes a communications unit 2010, an input unit 2020, an output unit 2030, a memory 2040, and a processor 2050.

The communications unit 2010 may include, for example, a wired or wireless communications module, a wireless Internet module, a local area communications module, a global positioning system (GPS) module, or a mobile communications module. The wired or wireless communications module included in the communications unit 2010 may be connected to external communications networks according to various communications standard specification to transmit and receive data.

The input unit 2020 may be a module provided to control an operation of the electronic device 2000 by a user and may include, for example, a mechanical switch, a touch screen, and/or a voice recognition module. Further, the input unit 2020 may include, for example, a mouse operating in a track ball or a laser pointer scheme or a finger mouse device. Still further, the input unit 2020 may include various sensor modules allowing for a user to input data thereto.

The output unit 2030 may output information processed in the electronic device 2000 in a sound or image form, and the memory 2040 may store program for the processing and the control of the processor 2050. The memory 2040 may include at least one non-volatile memory device according to various example embodiments of the present disclosure as described with reference to FIGS. 1 to 13. The processor 2050 may transfer a command to the memory 2040 according to a desired operation to thereby store or fetch data.

The memory 2040 may be embedded in the electronic device 2000 to directly communicate with the processor 2050 or communicate with the processor 2050 through a separate interface. In a case in which the memory 2040 communicates with the processor 2050 through a separate interface, the processor 2050 may store or fetch data, through various interface standards (e.g., SD, SDHC, SDXC, MICRO SD, USB, etc.).

The processor 2050 may control operations of respective components included in the electronic device 2000. The processor 2050 may perform control and processing in association with, for example, voice communications, video telephony, and/or data communications, or may perform control and processing for multimedia reproduction and management. Further, the processor 2050 may process an input transferred from a user through the input unit 2020 and may output results thereof through the output unit 2030. Still further, the processor 2050 may store data desired in controlling the operation of the electronic device 2000 as described above, in the memory 2040, or fetch data from the memory 2040.

As set forth above, according to some example embodiments of the present disclosure, a non-volatile memory device may be provided with an asymmetrical transistor, which has improved reliability and improved hot carrier characteristics, in a peripheral circuit area.

While some example embodiments have been shown and described above, it will be apparent to those skilled in the art that modifications and variations of the described example embodiments could be made without departing from the spirit and scope of example embodiments of the present disclosure as defined by the appended claims.

What is claimed is:

1. A non-volatile memory device comprising:
a cell array area including a plurality of memory cells and word lines and bit lines, the word lines and bit lines connected to the plurality of memory cells;
a core circuit area including a page buffer circuit and a row decoder circuit, the page buffer circuit configured to temporarily store data input to and output from the plurality of memory cells, and the row decoder circuit configured to select some of the word lines corresponding to an address input thereto; and
an input/output circuit area including a data input/output buffer circuit, the data input/output buffer circuit configured to at least one of transmit data to the page buffer circuit and receive data from the page buffer circuit, and the input/output circuit area including at least one asymmetrical transistor having a source region and a drain region asymmetrically disposed with respect to a gate structure,
wherein the drain region of the at least one asymmetrical transistor includes a first drain region and a second drain region, the second drain region doped with impurities at a higher level of concentration than that of the first drain region, and
wherein the source region of the at least one asymmetrical transistor is a single region having substantially the same concentration as that of the second drain region, and a distance from a central axis of the gate structure to the second drain region is greater than a distance from the central axis of the gate structure to the source region.

2. The non-volatile memory device of claim 1, wherein the source region of the at least one asymmetrical transistor includes a first source region and a second source region, the second source region doped with impurities at a higher level of concentration than that of the first source region, and
a distance from a central axis of the gate structure to the second drain region is greater than a distance from the central axis of the gate structure to the second source region.

3. The non-volatile memory device of claim 2, wherein the first source region and the first drain region have junction depths smaller than those of the second source region and the second drain region,
the first source region and the first drain region are disposed in portions of a substrate adjacent to the gate structure, and
at least one portion of the first source region and a least one portion of the first drain region extend below the gate structure.

4. The non-volatile memory device of claim 1, wherein the at least one asymmetrical transistor further includes:
a first spacer on one side of the gate structure, and
a second spacer on opposite side of the gate structure.

5. The non-volatile memory device of claim 4, wherein the first spacer and the second spacer are symmetrically disposed with respect to the gate structure.

6. The non-volatile memory device of claim 4, wherein the first spacer includes a first spacer insulating layer having an L-shaped cross-section and a second spacer insulating layer, and
a thickness of the first spacer from a first side surface of the gate structure is greater than a thickness of the second spacer from a second side surface of the gate structure, the second side surface being opposite to the first side surface.

7. The non-volatile memory device of claim 6, wherein a thickness of the second spacer insulating layer from the first side surface of the gate structure is greater than that of the first spacer insulating layer.

8. The non-volatile memory device of claim 6, wherein the drain region includes a first drain region and a second drain region, the second drain region doped with impurities at a higher level of concentration than that of the first drain region, and
at least one portion of the second drain region extends below the first spacer.

9. The non-volatile memory device of claim 4, further comprising:
a plurality of asymmetrical transistors including the at least one asymmetrical transistor and disposed in the input/output circuit area, wherein a portion of the plurality of asymmetrical transistors includes the first spacer and the second spacer symmetrically disposed with respect to the gate structure.

10. The non-volatile memory device of claim 4, wherein the at least one asymmetrical transistor further includes a buffer insulating layer between the gate structure and the first and second spacers.

11. The non-volatile memory device of claim 1, wherein the cell array area includes a plurality of channel regions, the channel regions extend in a first direction perpendicular to an upper surface of a substrate,
a plurality of cell gate electrodes crossing the channel regions in a second direction while being spaced apart from each other, and
a plurality of gate dielectric layers between the channel regions and the cell gate electrodes.

12. The non-volatile memory device of claim 1, wherein the core circuit area includes at least one symmetrical transistor having a source region and a drain region symmetrically disposed with respect to a gate structure.

13. A non-volatile memory device comprising:
a cell array area including a plurality of memory cells; and
a peripheral circuit area configured to control an operation of the plurality of memory cells, the peripheral circuit area including at least one asymmetrical transistor having a source region and a drain region asymmetrically disposed with respect to a gate structure, the source region including a first source region and a second source region, the second source region doped with impurities at a higher level of concentration than that of the first source region, the drain region including a first drain region and a second drain region, the second drain region doped with impurities at a higher level of concentration than that of the first drain region,
wherein a distance from a central axis of the gate structure to the second drain region is greater than a distance from the central axis of the gate structure to the second source region.

14. A non-volatile memory device comprising:
a peripheral circuit area including,
a first circuit area including an asymmetrical transistor, the asymmetrical transistor having a source region and a drain region asymmetrically disposed with respect to a gate structure, and
a second circuit area including a symmetrical transistor, the symmetrical transistor having a source region and a drain region symmetrically disposed with respect to a gate structure,
wherein the asymmetrical transistor has a first spacer and a second spacer separately and asymmetrically disposed with respect to the gate structure, the first spacer having a dual spacer structure including a first spacer insulating layer having an L-shaped cross-section and a second spacer insulating layer, and the second spacer having a single spacer structure, and the asymmetrical transistor further includes a buffer insulating layer between the first spacer and the gate structure and between the second spacer and the gate structure.

15. The non-volatile memory device of claim 14, wherein the second circuit area includes at least one of a page buffer circuit and a row decoder.

16. The non-volatile memory device of claim 14, wherein the first circuit area includes an input/output circuit.

17. The non-volatile memory device of claim 14, wherein the drain region of the asymmetrical transistor includes a first drain region and a second drain region, the second drain region doped with impurities at a higher level of concentration than that of the first drain region, and the source region of the asymmetrical transistor is a single region having substantially the same concentration as that of the second drain region, and
a distance from a central axis of the gate structure of the asymmetrical transistor to the second drain region is greater than a distance from the central axis of the gate structure to the source region.

18. The non-volatile memory device of claim 14, wherein the drain region of the asymmetrical transistor includes a first drain region and a second drain region, the second drain region doped with impurities at a higher level of concentration than that of the first drain region,
the source region of the asymmetrical transistor includes a first source region and a second source region, the second source region doped with impurities at a higher level of concentration than that of the first source region, and
a distance from a central axis of the gate structure of the asymmetrical transistor to the second drain region is greater than a distance from the central axis of the gate structure of the asymmetrical transistor to the second source region.

* * * * *